United States Patent [19]

Tamura et al.

[11] Patent Number: 6,017,973
[45] Date of Patent: Jan. 25, 2000

[54] PHOTOCURABLE RESIN COMPOSITION, METHOD OF PRODUCING PHOTO-CURED SHAPED OBJECT, VACUUM CASTING MOLD, VACUUM CASTING METHOD AND NOVEL URETHANE ACRYLATE

[75] Inventors: Yorikazu Tamura; Tsuneo Hagiwara, both of Kawasaki; Yasushi Ishihama; Minoru Kayanoki, both of Wakayama; Takakuni Ueno, Kawasaki, all of Japan

[73] Assignee: Teijin Seiki Company, Ltd., Osaka, Japan

[21] Appl. No.: 08/857,639

[22] Filed: May 16, 1997

[30] Foreign Application Priority Data

May 23, 1996 [JP] Japan ................................. 8-151653
May 16, 1996 [JP] Japan ................................. 8-146790
Feb. 24, 1997 [JP] Japan ................................. 9-055542

[51] Int. Cl.$^7$ ............................. C08G 18/10; G03C 1/73; G03C 9/08; C08F 2/50
[52] U.S. Cl. ................................. 522/96; 522/97; 522/90; 430/269; 430/284.1; 264/401; 264/496; 528/59; 526/301
[58] Field of Search ............................ 522/97, 90, 173, 522/174, 96; 528/59; 430/269, 284.1; 264/401, 496; 526/301

[56] References Cited

U.S. PATENT DOCUMENTS

| | | | |
|---|---|---|---|
| 4,340,497 | 7/1982 | Knopf | ........................ 522/97 |
| 4,942,066 | 7/1990 | Fan et al. . | |
| 5,002,854 | 3/1991 | Fan et al. . | |
| 5,002,855 | 3/1991 | Fan et al. . | |
| 5,014,207 | 5/1991 | Lawton . | |
| 5,461,088 | 10/1995 | Wolf et al. . | |
| 5,495,029 | 2/1996 | Steinmann et al. . | |
| 5,510,226 | 4/1996 | Lapin et al. . | |
| 5,591,563 | 1/1997 | Suzuki et al. . | |
| 5,703,141 | 12/1997 | Jin | ........................ 522/97 |

FOREIGN PATENT DOCUMENTS

| | | |
|---|---|---|
| 0 463 862 | 1/1992 | European Pat. Off. . |
| 502562 | 2/1992 | European Pat. Off. . |
| 0 579 503 | 1/1994 | European Pat. Off. . |
| 37 03080 A1 | 1/1988 | Germany . |
| 56-144478 | 11/1981 | Japan . |
| 60-247515 | 12/1985 | Japan . |
| 61-185522 | 8/1986 | Japan . |
| 62-35966 | 2/1987 | Japan . |
| 1-204915 | 8/1989 | Japan . |
| 1-213304 | 8/1989 | Japan . |
| 2-28261 | 1/1990 | Japan . |
| 2-75617 | 3/1990 | Japan . |
| 2-113925 | 4/1990 | Japan . |
| 2-145616 | 6/1990 | Japan . |
| 2-153722 | 6/1990 | Japan . |
| 3-15520 | 1/1991 | Japan . |
| 3-21432 | 1/1991 | Japan . |
| 3-104626 | 5/1991 | Japan . |
| 3-114711 | 5/1991 | Japan . |
| 3-114732 | 5/1991 | Japan . |
| 3-114733 | 5/1991 | Japan . |
| 3-41126 | 2/1992 | Japan . |

OTHER PUBLICATIONS

Patent Abstracts of Japan, 18(558) Oct. 25, 1994 Optical Three–Dimensional . . . . JP 06 199962 A Takemoto Oil & Fat Co. LTD. Jul. 19, 1994.

Patent Abstracts of Japan, 96(11) Nov. 29, 1996, "Stereolithographic Resin" JP 08 183822 A Takemoto Oil & Fat Co. LTD. Dec. 28, 1994.

*Primary Examiner*—Susan W. Berman
*Attorney, Agent, or Firm*—Eugene Lieberstein; Michael M. Meller

[57] ABSTRACT

A photocurable resin composition comprising (A) at least one urethane di- or triacrylate, which is a novel compound, (B) a radical polymeriable compound, and (C) a photopolymerization initiator, the weight ratio of the urethane acrylate (A) to the radical polymerizable compound (B) being 65/35 to 25/75; a method of producing a photo-cured object by photo-curing the above composition; a vacuum casting mold obtained by the above method; and a vacuum casting method using the above mold.

8 Claims, 1 Drawing Sheet

PHOTOCURABLE RESIN COMPOSITION, METHOD OF PRODUCING PHOTO-CURED SHAPED OBJECT, VACUUM CASTING MOLD, VACUUM CASTING METHOD AND NOVEL URETHANE ACRYLATE

BACKGROUND OF THE INVENTION

This invention relates to a photocurable resin composition, a method of producing a shaped object by photo-curing the composition, a vacuum casting mold as a shaped object, a vacuum casting method using the above mold, and a novel urethane acrylate suitable as a photocurable component of the composition. More specifically, it relates to a photocurable resin composition which has excellent dimensional accuracy with a small volume shrinkage factor when it is photo-cured and can provide moldings and stereolithographed objects such a vacuum casting mold, which have excellent flexibility, elastic recovery and mechanical properties; a method of producing a shaped object by photo-curing the composition; a vacuum casting mold which has excellent release properties and is capable of producing moldings having excellent dimensional accuracy at a high productivity; a vacuum casting method using the above mold; and a novel urethane acrylate.

Generally, a liquid photocurable resin composition is widely used as a coating material, photoresist, dental material or the like. In recent years, particular attention has been paid to a method of optically shaping a photocurable resin composition three-dimensionally based on data input into a three-dimensional CAD system.

As for optical stereolithography technology, JP-A 56-144478 (the term "JP-A" as used herein means an "unexamined published Japanese patent application") discloses an optical stereolithography for producing a stereolithographed object, which comprises the steps of supplying a required amount of controlled optical energy to a liquid photocurable resin to cure it into a thin layer, further supplying a liquid photocurable resin onto the layer, irradiating the resin with light under control to cure it into a thin layer to be laminated on the above thin layer, and repeating this procedure to produce a stereolithographed object. A basic practical method therefor is further proposed in JP-A 60-247515. Since then, various optical stereolithography technologies have been disclosed in JP-A 62-35966, JP-A 1-204915, JP-A 2-113925, JP-A 2-145616, JP-A 2-153722, JP-A 3-15520, JP-A 3-21432 and JP-A 3-41126.

A typical method of optically producing a stereolithographed object comprises the steps of selectively irradiating a surface of a liquid photocurable resin composition in a container with light from an ultraviolet laser controlled by a computer to cure it to a predetermined thickness so as to obtain a desired pattern, supplying one layer of the liquid photocurable resin composition onto the cured layer, irradiating it with light from the ultraviolet laser similarly to cure it to form a continuous and integral cured layer, and repeating this lamination procedure until a stereolithographed object having a final shape is obtained. This typical method is commonly and widely used. Since this method makes it possible produce an intended stereolithographed object having a very complex shape easily and in a relatively short period of time, it has been attracting much attention in recent years.

As the photocurable resin composition used as a coating material, photoresist, dental material or the like, curable resins such as an unsaturated polyester, epoxy (meth)acrylate, urethane (meth)acrylate or (meth)acrylic acid ester monomer to which a photopolymerization initiator is added, are widely used.

The photocurable resin composition used in the optical stereolithography includes those containing at least one photopolymerizable compound such as a photopolymerizable modified urethane (meth)acrylate-based compound, oligoester acrylate-based compound, epoxy acrylate-based compound, epoxy-based compound, polyimide-based compound, aminoalkyd-based compound, vinyl ether-based compound and the like as a main component(s) and a photopolymerization initiator. In recent years, JP-A 1-204915, JP-A 1-213304, JP-A 2-28261, JP-A 2-75617, JP-A 2-145616, JP-A 3-104626, JP-A 3-114732 and JP-A 3-1147324 have disclosed techniques for improving these substances.

It is required from viewpoints of handling properties, shaping speed, shaping accuracy and the like that the photocurable resin composition used in the optical stereolithography be a liquid having a low viscosity, have a small volume shrinkage when it is cured and provide a stereolithographed object having excellent mechanical properties when it is photo-cured. In recent years, with expanding demand and applications of optical stereolithographed objects, stereolithographed objects having high elongation, flexibility and elastic recovery properties in addition to the above characteristics are desired in some applications. For example, stereolithographed objects used for such applications as cushion materials, vacuum molding molds and the like are required to have high flexibility, high elongation and elastic recovery properties.

As a method for producing an optical stereolithographed object having flexibility, there is known one which comprises the steps of incorporating a thermally coherent polymer material comprising vinyl chloride resin powders and a plasticizer in a photocurable resin, curing the photocurable resin to obtain an optical stereolithographed object and thermally cohering the obtained stereolithographed object (see the above JP-A 3-104626). This method, however, has drawbacks that since a thermally coherent polymer is contained in the photocurable resin, the viscosity of the resin composition becomes high, so that handling properties and accuracy in shaping deteriorate. In addition, since a plasticizer is used, the resin composition is inferior in mechanical properties such as tear resistance and has such problems as transfer or oozing of the plasticizer to the surface of the resulting stereolithographed object. Therefore, satisfactory results are not achieved by this method.

Meanwhile, an urethane acrylate-based resin composition in which a caprolactone unit is bonded between urethane groups to improve tensile elongation is known (see JP-A 61-185522). A cured product therefrom has somewhat improved tensile elongation but is still unsatisfactory in flexibility.

A method of producing a molding by placing a mold in a vacuum atmosphere (reduced pressure atmosphere), injecting a curable resin such as polyurethane into the mold and curing the resin has been widely known as a vacuum casting method before the application of the present invention. In the case of the vacuum casting method, a molding having high dimensional accuracy and no air bubbles can be obtained smoothly because the resin component is injected into every corner of the mold swiftly and no air bubbles are contained into the resin as the resin component is injected into the mold under vacuum.

Further, as the vacuum casting method does not require large clamping force unlike an injection molding method, the strength of the mold is not required to be so high. Therefore, a silicon rubber-made vacuum casting mold which is excellent in such properties as flexibility, elasticity and release properties and allows a molding to be removed therefrom with ease has been widely used as a vacuum casting mold.

In this case, the production of a silicon rubber-made vacuum casting mold and a vacuum casting method using this mold are carried out by the following steps.

(1) A master model is fabricated mechanically and manually using an ABS resin or the like.
(2) The master model fabricated in the above step is surrounded by an enveloping plate made from an acrylic resin or the like and a releasing agent is applied to the surface of the master model and the interior surface of the enveloping plate.
(3) Curable silicon rubber which has been in advance vacuum defoamed as required is injected into the space formed by the master model and the enveloping plate and is cured by letting it stand, for example, at 50° C. for 13 hours.
(4) The cured silicon rubber is opened by cutting it with an operation knife as required and separated out from the master model to obtain a silicon rubber-made vacuum casting mold.
(5) The silicon rubber-made vacuum casting mold obtained in the above step (4) is placed in a vacuum vessel and a liquid polymer material such as polyurethane which has been in advance vacuum defoamed as required is injected into the mold and cured or solidified.
(6) The vacuum casting operation of the above step (5) is repeated as required to produce a plurality of vacuum cast moldings.

As is obvious from the above description, in the case of the above prior art method which uses a silicon rubber-made vacuum casting mold, a series of complicated production steps which take much time and labor such as the above-described steps (1) to (4) for the production of a master model and the production of a silicon rubber-made vacuum casting mold using the master model are required to produce a silicon rubber-made vacuum casting mold. In addition, since a master model is used, dimensional distortion tends to occur during the production of a master model and during the production (transfer) of a silicon rubber mold from the master model, and it is difficult to obtain a silicon rubber-made vacuum casting mold having excellent dimensional accuracy.

There is further proposed a method in which an ultraviolet light-curable resin is injected into a transparent silicon rubber mold formed from optically transparent silicon rubber which is curable at room temperature and cured under irradiation of ultraviolet light to produce a molding (JP-A 3-114711). However, this method also needs a series of complicated production steps which take much time and labor similar to the above-described steps (1) to (4) because a transparent silicon rubber mold must be fabricated using a master model. In addition, a dimensional distortion tends to occur during the production of a master model and during the production (transfer) of a transparent silicon rubber mold from the master model and it is difficult to obtain a transparent silicon rubber mold having excellent dimensional accuracy.

SUMMARY OF THE INVENTION

It is therefore an object of the present invention to provide a novel photocurable resin composition.

It is another object of the present invention to provide a photocurable resin composition which is a low-viscosity liquid, has excellent handling properties, can be cured in a short period of time, and can provide moldings, stereolithographed objects and other cured products having excellent dimensional accuracy with a small volume shrinkage factor, and further having flexibility, elastic recovery and mechanical properties such as tensile strength and tensile elongation when it is photo-cured.

It is a further object of the present invention to provide a method of producing a stereolithographed object by photo-curing the above photocurable resin composition of the present invention by an optical stereolithography.

It is a still further object of the present invention to provide a vacuum casting mold which can be produced by a simple operation at a high dimensional accuracy without using a master model.

It is still another object of the present invention to provide a vacuum casting mold which has excellent properties such as flexibility, elongation and elastic recovery properties and which is transparent and allows transmission of ultraviolet light when occasion demands and from which a molding can be taken out with ease after vacuum casting.

It is still another object of the present invention to provide a vacuum casting method which uses the above vacuum casting mold of the present invention.

It is still another object of the present invention to provide a novel urethane acrylate which can be used in the above photocurable resin composition of the present invention as a photocurable component.

Other objects and advantages of the present invention will become apparent from the following description.

According to the present invention, the above objects and advantages of the present invention can be first attained by a photocurable resin composition which comprises:

(A) at least one urethane acrylate selected from the group consisting of (a) a first urethane acrylate represented by the following formula (1):

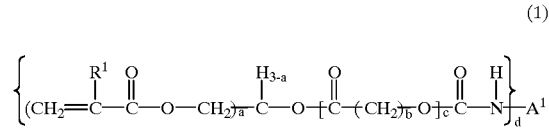

(1)

wherein $R^1$ is a hydrogen atom or a methyl group, $A^1$ is a divalent or trivalent substituted or unsubstituted hydrocarbon group, a is 1 or 2, b is an integer of 3 to 6, c is an integer of 3 to 14, and d is 2 or 3, provided that at least one $R^1$ is a methyl group when a is 2, (b) a second urethane acrylate represented by the following formula (2):

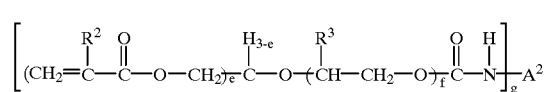

(2)

wherein $R^2$ and $R^3$ are each independently a hydrogen atom or a methyl group, $A^2$ is a divalent or trivalent substituted or unsubstituted hydrocarbon group, e is 1 or 2, f is an integer of 4 to 20, and g is 2 or 3, provided that at least one $R^2$ is a methyl group when e is 2, and (c) a third urethane acrylate represented by the following formula (3):

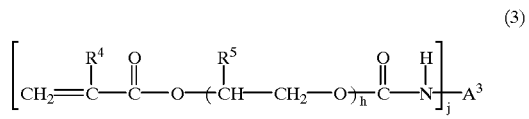
(3)

wherein $R^4$ and $R^5$ are each independently a hydrogen atom or a methyl group, $A^3$ is a divalent or trivalent substituted or unsubstituted hydrocarbon group, h is an integer of 4 to 20, and j is 2 or 3, (B) a radical polymerizable compound different from the above urethane acrylate (A), and (C) a photopolymerization initiator, the weight ratio of the urethane acrylate (A) to the radical polymerizable compound (B) being 80/20 to 10/90.

DETAILED DESCRIPTION OF THE EMBODIMENTS

Figure 1:
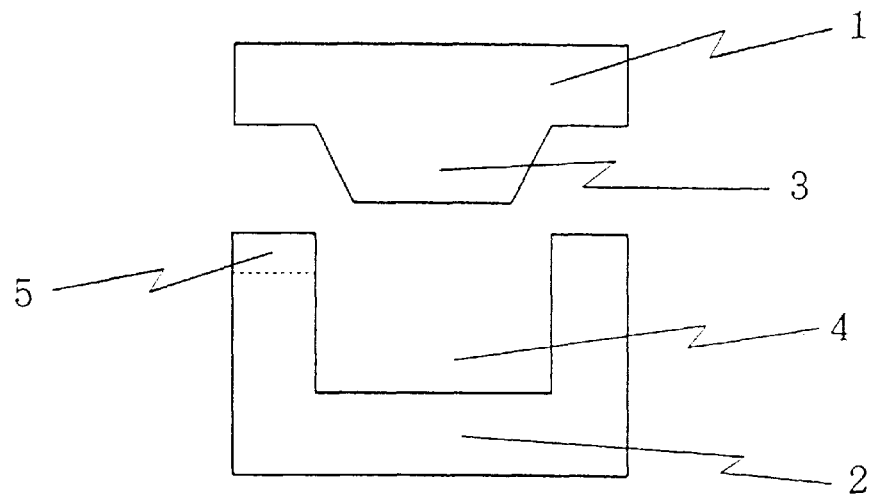
FIG. 1 is a schematic sectional view of a vacuum casting mold produced by an optical shaping method in the example of the present invention.

The urethane acrylate (A) used in the present invention is selected from a first urethane acrylate represented by the above formula (1), a second polyurethane acrylate represented by the formula (2) and a third urethane acrylate represented by the formula (3).

In the formula (1) representing the first urethane acrylate, $R^1$ is a hydrogen atom or a methyl group, a is 1 or 2, and when a is 2, at least one of $R^1$'s in the two groups $CH_2=C(R^1)-COO-CH_2-$ must be a methyl group. If when a is 2 in the formula (1) and both $R^1$'s in the two groups $CH_2=C(R^1)-COO-CH_2-$ are a hydrogen atom, glycerine diacrylate which is extremely toxic, carcinogenic and stimulative to the skin is produced in the course of synthesis. Therefore, such a compound cannot be virtually used.

In the formula (1), b is an integer of 3 to 6, preferably 5 from a view point of stability and ease of production of the first urethane acrylate.

In the formula (1), c must be an integer of 3 to 14, preferably 3 to 10, more preferably 3 to 6. If c is more than 15, the melting point of the urethane acrylate is high, thereby making it difficult to obtain a photocurable resin composition having excellent flowability at room temperature even when a low-molecular weight radical polymerizable compound is used as the radical polymerizable compound (to be referred to as "radical polymerizable compound (B)" hereinafter). In addition, the tensile elongation and flexibility of a cured product obtained by photo-curing the photocurable resin composition deteriorate, whereby an intended stereolithographed object or molding having excellent flexibility and elastic recovery properties cannot be obtained. If c is less than 3, the tensile elongation and flexibility of a cured product obtained by photo-curing also deteriorate, so that an intended stereolithographed object or a molding having excellent flexibility and elastic recovery properties cannot be obtained.

In the formula (1), d must be 2 or 3. When the first urethane acrylate of the formula (1) wherein d is 2 is used, the flexibility and tensile elongation of a photo-cured product such as a stereolithographed object or a molding obtained from the photocurable resin composition of the present invention tend to be high, compared with the case where the first urethane acrylate of the formula (1) wherein d is 3 is used. However, in either case, a stereolithographed object or a molding having high tensile elongation and excellent flexibility can be obtained.

In the formula (1), the group $A^1$ is a divalent or trivalent substituted or unsubstituted hydrocarbon group, preferably a substituted or unsubstituted aliphatic, aromatic and/or alicyclic divalent or trivalent hydrocarbon group having 6 to 20 carbon atoms. The first urethane acrylate can be preferably produced using a diisocyanate compound or a triisocyanate compound represented by the general formula $A^1-(NCO)d$ ($A^1$ and d have the same definition as above) as will be described hereinafter. In view of this, the group $A^1$ is preferably a divalent or trivalent residual group which remains after the isocyanate group is removed from a diisocyanate compound or a triisocyanate compound used in the production of the first urethane acrylate. More specifically, preferred examples of the group $A^1$ in the formula (1) include isophorone, tolylene, 4,4'-diphenyl methane, naphthylene, xylylene, phenylene, 3,3'-dichloro-4,4'-phenylmethane, toluylene, hexamethylene, 4,4'-dicyclohexylmethane, hydrogenated xylylene, triphenylenemethane, tetramethylxylene and the like.

A method of producing the first urethane acrylate is not limited to a particular one. Regardless of its production method, the compound represented by the above formula (1) and the photocurable resin composition containing the compound are included in the scope of the present invention. The first urethane acrylate can be preferably produced by the following method.

[Typical method of producing first urethane acrylate]

The method of producing the first urethane acrylate comprises the steps of:

(1) reacting lactone represented by the following formula (ii):

(ii)

wherein b is the same as defined above, with one mole of mono(meth)acrylic acid ester of ethylene glycol or di(meth)acrylic acid ester of glycerine represented by the following formula (i):

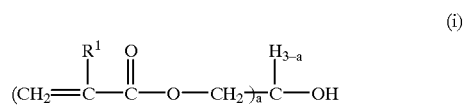
(i)

wherein $R^1$ and a are the same as defined above, to prepare an addition compound of lactone represented by the following formula (iii):

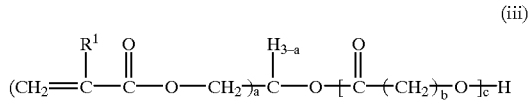

wherein $R^1$, a, b and c are the same as defined above, and then, (2) reacting the addition compound of lactone represented by the above formula (iii) obtained in the above step (1) with a diisocyanate compound or a triisocyanate compound represented by the above general formula $A^1$—$(NCO)_d$ to produce the first urethane acrylate.

In the above reaction (1), the mono(meth)acrylic acid ester of ethylene glycol or the di(meth)acrylic acid ester of glycerine is preferably reacted with lactone generally at 100 to 140° C. in the presence of a cationic catalyst, anionic catalyst or organic tin catalyst (such as dibutyltin or the like) as required, whereby the lactone addition compound represented by the above formula (iii) can be obtained smoothly.

In the above reaction (2) for reacting the lactone addition compound represented by the above formula (iii) with the above diisocyanate compound or triisocyanate compound, when the both substances are allowed to react at 40 to 90° C. in the presence of a conventionally known catalyst for the production of urethane, such as an organic tin catalyst, tertiary amine catalyst or the like, the intended first urethane acrylate can be obtained smoothly.

The diisocyanate compound and triisocyanate compound represented by the formula $A^1$—$(NCO)_d$ used in the above reaction (2) are not limited to particular kinds and any diisocyanate compounds and triisocyanate compounds which can produce urethane are acceptable.

Of these, the preferred are isophorone diisocyanate, tolylene diisocyanate, 4,4'-diphenylmethane diisocyanate, naphthylene diisocyanate, xylylene diisocyanate, phenylene diisocyanate, 3,3'-dichloro-4,4'-phenylmethane diisocyanate, toluylene diisocyanate, hexamethylene diisocyanate, 4,4'-dicyclohexylmethane diisocyanate, hydrogenated xylylene diisocyanate, triphenylmethane triisocyanate, tetramethylxylene diisocyanate, hydrogenated 4,4'-diphenylmethane diisocyanate and the like. These isocyanate compounds may be used alone or in combination of two or more. Of the above isocyanate compounds, isophorone diisocyanate, hydrogenated xylylene diisocyanate and hydrogenated 4,4'-diphenylmethane diisocyanate are particularly preferred. In this case, a photo-cured product having excellent flexibility and high tensile elongation can be obtained from the photocurable resin composition of the present invention containing the first urethane acrylate.

In the formula (2) representing the second urethane acrylate, $R^2$ and $R^3$ are each independently a hydrogen atom or a methyl group, e is 1 or 2, and when e is 2, at least one of $R^2$,s in the two groups $CH_2=C(R^2)$—COO—$CH_2$— must be a methyl group. If when e is 2 in the formula (2) and both $R^2$,s in the two groups $CH_2=C(R^2)$—COO—$CH_2$— are a hydrogen atom, glycerine diacrylate which is extremely toxic, carcinogenic and stimulative to the skin is produced in the course of synthesis. Therefore, such a compound cannot be used virtually.

In the formula (2), f must be an integer of 4 to 20, preferably 5 to 14, more preferably 6 to 10. When f is more than 20, the melting point of the urethane acrylate is high, thereby making it difficult to obtain a photocurable resin composition having excellent flowability at room temperature even when a low-molecular weight radical polymerizable compound is used as the radical polymerizable compound B. In addition, the tensile elongation and flexibility of a cured product obtained by photo-curing the photocurable resin composition deteriorate, whereby an intended stereolithographed object or molding having excellent flexibility and elastic recovery properties cannot be obtained. If f is less than 4, the tensile elongation and flexibility of a cured product obtained by photo-curing also deteriorate, whereby an intended stereolithographed object or molding having excellent flexibility and elastic recovery properties cannot be obtained.

Further, in the formula (2), g must be 2 or 3. When the second urethane acrylate of the formula (2) wherein g is 2 is used, the flexibility and tensile elongation of a photo-cured product such as a stereolithographed object or a molding obtained from the photocurable resin composition of the present invention tend to be high, compared with the case where the second urethane acrylate of the formula (2) wherein g is 3 is used. However, in either case, a stereolithographed object or a molding having high tensile elongation and excellent flexibility can be obtained.

In the formula (2), the group $A^2$ is a divalent or trivalent substituted or unsubstituted hydrocarbon group, preferably a substituted or unsubstituted aliphatic, aromatic and/or alicyclic divalent or trivalent hydrocarbon group having 6 to 20 carbon atoms.

The second urethane acrylate can be preferably produced using a diisocyanate compound or a triisocyanate compound represented by the general formula $A^2$—$(NCO)_g$ ($A^2$ and g have the same definition as above) as will be described hereinafter. In view of this, the group $A^2$ is preferably a divalent or trivalent residual group which remains after the isocyanate group is removed from a diisocyanate compound or triisocyanate compound used in the production of the second urethane acrylate. More specifically, preferred examples of the group $A^2$ in the second urethane acrylate include isophorone, tolylene, 4,4'-diphenyl methane, naphthylene, xylylene, phenylene, 3,3'-dichloro-4,4'-phenylmethane, toluylene, hexamethylene, 4,4'-dicyclohexylmethane, hydrogenated xylylene, triphenylenemethane, tetramethylxylene and the like.

A method of producing the second urethane acrylate is not limited to a particular one. Regardless of the production method, the compound represented by the above formula (2) and the photocurable resin composition containing the compound are included in the scope of the present invention. The second urethane acrylate can be preferably produced by the following method.

[Typical method of producing second urethane acrylate]

The method of producing the second urethane acrylate comprises the steps of:

(1) reacting at least one of propylene oxide ($R^3=CH_3$ in the above formula (v)) and ethylene oxide ($R^3=H$ in the above formula (v)) represented by the following formula (v):

wherein $R^3$ is the same as defined above, with one mole of mono(meth)acrylic acid ester of ethylene glycol or di(meth)acrylic acid ester of glycerine represented by the following formula (iv):

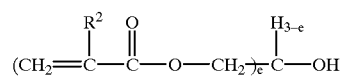

wherein $R^2$ and e are the same as defined above, to prepare an addition compound of propylene oxide and/or ethylene oxide represented by the following formula (vi):

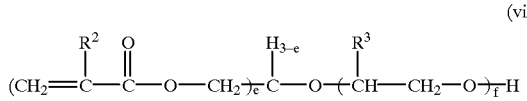

wherein $R^2$, $R^3$, e and f are the same as defined above, and then, p (2) reacting the addition compound of propylene oxide and/or ethylene oxide represented by the above formula (vi) obtained in the above step (1) with a diisocyanate compound or a triisocyanate compound represented by the above-described general formula $A^2$—(NCO)g to produce the second urethane acrylate.

In the above reaction (1), the mono(meth)acrylic acid ester of ethylene glycol or the di(meth)acrylic acid ester of glycerine is preferably reacted with propylene oxide and/or ethylene oxide in the presence of a catalyst, whereby the addition compound of propylene oxide and/or ethylene oxide represented by the above formula (vi) can be obtained smoothly. Since the addition compound of propylene oxide and/or ethylene oxide represented by the formula (vi) is already known, a known one may be used as it is.

In the above reaction (2) for reacting the addition compound of propylene oxide and/or ethylene oxide represented by the above formula (vi) with the above diisocyanate compound or triisocyanate compound represented by the general formula $A^2$—(NCO)g, when the both substances are allowed to react with each other at 40 to 90° C. in the presence of a conventionally known catalyst such as an organic tin catalyst, tertiary amine catalyst or the like, the intended second urethane acrylate can be obtained smoothly.

The diisocyanate compound and triisocyanate compound represented by the general formula $A^2$—(NCO)g to be reacted with the addition compound represented by the formula (vi) in the above reaction (2) are not limited to particular kinds and any diisocyanate compounds and triisocyanate compounds which can produce urethane are acceptable. Of these, the preferred are isophorone diisocyanate, tolylene diisocyanate, 4,4'-diphenylmethane diisocyanate, naphthylene diisocyanate, xylylene diisocyanate, phenylene diisocyanate, 3,3'-dichloro-4,4'-phenylmethane diisocyanate, toluylene diisocyanate, hexamethylene diisocyanate, 4,4'-dicyclohexylmethane diisocyanate, hydrogenated xylylene diisocyanate, triphenylmethane triisocyanate, tetramethylxylene diisocyanate, hydrogenated 4,4'-diphenylmethane diisocyanate and the like. These isocyanate compounds may be used alone or in combination of two or more. Of the above isocyanate compounds, isophorone diisocyanate, hydrogenated xylylene diisocyanate and hydrogenated 4,4'-diphenylmethane diisocyanate are particularly preferred. In this case, a photo-cured product having excellent flexibility and high tensile elongation can be obtained from the photocurable resin composition of the present invention containing the second urethane acrylate.

In the formula (3) representing the third urethane acrylate, $R^4$ and $R^5$ are each independently a hydrogen atom or a methyl group. h must be an integer of 4 to 20, preferably 5 to 14, more preferably 6 to 10. If h is more than 20, the melting point of the urethane acrylate is high, thereby making it difficult to obtain a photocurable resin composition having excellent flowability at room temperature even when a low-molecular weight radical polymerizable compound is used as the radical polymerizable compound B. In addition, the tensile elongation and flexibility of a cured product obtained by photo-curing the photocurable resin composition deteriorate, whereby an intended stereolithographed object or molding having excellent flexibility and elastic recovery properties cannot be obtained. If h is less than 4, the tensile elongation and flexibility of a cured product obtained by photo-curing also deteriorate, whereby an intended stereolithographed object or molding having excellent flexibility and elastic recovery properties cannot be obtained.

In the formula (3), j must be 2 or 3. When the third urethane acrylate of the formula (3) wherein j is 2 is used, the flexibility and tensile elongation of a photo-cured product such as a stereolithographed object or a molding obtained from the photocurable resin composition of the present invention tend to be high, compared with the case where the third urethane acrylate of the formula (3) wherein j is 3 is used. However, in either case, a stereolithographed object or a molding having high tensile elongation and excellent flexibility can be obtained.

In the formula (3), the group $A^3$ is a divalent or trivalent substituted or unsubstituted hydrocarbon group, preferably a substituted or unsubstituted aliphatic, aromatic and/or alicyclic divalent or trivalent hydrocarbon group having 6 to 20 carbon atoms.

The third urethane acrylate can be preferably produced using a diisocyanate compound or a triisocyanate compound represented by the general formula $A^3$—(NCO)j ($A^3$ and j have the same definition as above) as will be described hereinafter. In view of this, the group $A^3$ is preferably a divalent or trivalent residual group which remains after the isocyanate group is removed from a diisocyanate compound or triisocyanate compound used in the production of the third urethane acrylate. More specifically, preferred examples of the group $A^3$ in the third urethane acrylate include isophorone, tolylene, 4,4'-diphenyl methane, naphthylene, xylylene, phenylene, 3,3'-dichloro-4,4'-phenylmethane, toluylene, hexamethylene, 4,4'-dicyclohexylmethane, hydrogenated xylylene, triphenylenemethane, tetramethylxylene and the like.

A method of producing the third urethane acrylate is not limited to a particular one. Regardless of its production method, the compound represented by the above formula (3) and the photocurable resin composition containing the compound are included in the scope of the present invention. The third urethane acrylate can be preferably produced by the following method.

[Typical method of producing third urethane acrylate]

The method of producing the third urethane acrylate comprises the steps of:

(1) reacting at least one of propylene oxide and ethylene oxide with acrylic acid or methacrylic acid to prepare an addition product of acrylic acid or methacrylic acid with propylene oxide and/or ethylene oxide represented by the following formula (vii):

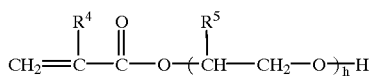

(vii)

wherein $R^4$, $R^5$ and h are the same as defined above, and then, (2) reacting the addition product represented by the above formula (vii) obtained in the above step (1) with a diisocyanate compound or triisocyanate compound represented by the above general formula $A^3$—(NCO)j to produce the third urethane acrylate.

In the above reaction (1), the acrylic acid and/or methacrylic acid are/is preferably reacted with propylene oxide and/or ethylene oxide in the presence of an appropriate catalyst, whereby the addition product represented by the above formula (vii) can be obtained smoothly.

In the above reaction (2) for reacting the addition product represented by the above formula (vii) with the above diisocyanate compound or triisocyanate compound represented by the general formula $A^3$—(NCO)j, when the both substances are allowed to react with each other at 40 to 90° C. in the presence of a conventionally known catalyst for the production of urethane, such as an organic tin catalyst, tertiary amine catalyst or the like, the intended third urethane acrylate can be obtained smoothly.

The diisocyanate compound and triisocyanate compound represented by the general formula $A^3$—(NCO)j to be reacted with the addition product represented by the formula (vii) in the above reaction (2) are not limited to particular kinds and any diisocyanate compounds and triisocyanate compounds which can produce urethane are acceptable. Of these, the preferred are isophorone diisocyanate, tolylene diisocyanate, 4,4'-diphenylmethane diisocyanate, naphthylene diisocyanate, xylylene diisocyanate, phenylene diisocyanate, 3,3'-dichloro-4,4'-phenylmethane diisocyanate, toluylene diisocyanate, hexamethylene diisocyanate, 4,4'-dicyclohexylmethane diisocyanate, hydrogenated xylylene diisocyanate, triphenylmethane triisocyanate, tetramethylxylene diisocyanate, hydrogenated 4,4'-diphenylmethane diisocyanate and the like. These isocyanate compounds may be used alone or in combination of two or more. Of the above isocyanate compounds, isophorone diisocyanate, hydrogenated xylylene diisocyanate and hydrogenated 4,4'-diphenylmethane diisocyanate are particularly preferred. In this case, a photo-cured product having excellent flexibility and high tensile elongation can be obtained from the photocurable resin composition of the present invention containing the third urethane acrylate.

The properties of the urethane acrylate differs according to kinds of the groups $R^1, R^2, R^3, R^4, R^5, A^1, A^2$ and $A^3$ and the numerals of a, b, c, d, e, f, g, h and j in the above formulas (1), (2) and (3). Generally, the first urethane acrylate, the second urethane acrylate and the third urethane acrylate are each liquids having a low to high viscosity at normal temperatures, and when such an urethane acrylate is used in combination with an appropriate compound as the radical polymerizable compound (B), there can be prepared a low-viscosity photocurable resin composition having excellent handling properties.

The photocurable resin composition of the present invention may contain either only one or a plurality of the first urethane acrylate, the second urethane acrylate and the third urethane acrylate.

The photocurable resin composition of the present invention contains at least one urethane acrylate and the radical polymerizable compound (B). The radical polymerizable compound (B) is preferably a radical polymerizable compound having a carbon—carbon unsaturated bond, which is capable of forming a cured product by reacting with the urethane acrylate or with the radical polymerizable compound (B) when it is irradiated with light. Acryl compounds and/or allyl compounds are preferably used. The radical polymerizable compound (B) may be either a monofunctional or polyfunctional compound or a mixture thereof. Further, the radical polymerizable compound (B) may be a monomer or oligomer having a low molecular weight or a somewhat large molecular weight as the case may be. The photocurable resin composition of the present invention may contain only one radical polymerizable compound or a plurality of radical polymerizable compounds as the radical polymerizable compound (B).

Preferred examples of the radical polymerizable compound include (meth)acrylates such as isobornyl (meth)acrylate, bornyl (meth)acrylate, dicyclopentenyl (meth)acrylate, 2-hydroxyethyl (meth)acrylate, 2-hydroxypropyl (meth)acrylate, (poly)propylene glycol mono(meth)acrylate and t-butyl (meth)acrylate; (meth)acrylamides such as morpholine (meth)acrylamide; monofunctional radical polymerizable compounds such as N-vinylcapolactone and styrene; and polyfunctional radical polymerizable compounds such as trimethylolpropane tri(meth)acrylate, ethylene oxide modified trimethylolpropane (tri)methacrylate, ethylene glycol di(meth)acrylate, diethylene glycol (meth)acrylate, triethylene glycol (meth)acrylate, tetraethylene glycol di(meth)acrylate, polyethylene glycol (meth)acrylate, 1,4-butanediol di(meth)acrylate, 1,6-hexanediol di(meth)acrylate, neopentylglycol di(meth)acrylate, dicyclopentenyl di(meth)acrylate, diallyl phthalate, diallyl fumarate and ethylene oxide modified bisphenol A diacrylate.

In addition to the above radical polymerizable compounds, epoxy compounds which are conventionally used in resin compositions for forming an optical stereolithographed object and urethane acrylates other than the above first, second and third urethane acrylates, epoxy (meth)acrylate compounds and other ester (meth)acrylates may be also used as the radical polymerizable compound (B).

The photocurable resin composition of the present invention may contain one or a plurality of the above radical polymerizable compounds as the radical polymerizable compound (B). Of the above radical polymerizable compounds, morpholine (meth)acrylamide and ethylene oxide modified bisphenol A diacrylate are preferably used in the photocurable resin composition of the present invention. In this case, there can be obtained a photocurable resin composition which can provide moldings, stereolithographed objects and other cured products having more excellent dimensional accuracy with a small volume shrinkage factor and more excellent flexibility, elastic recovery and mechanical properties when it is photo-cured.

In the photocurable resin composition of the present invention, the weight ratio of the urethane acrylate (A) to the radical polymerizable compound (B) is in the range of 80/20 to 10/90. This weight ratio is preferably in the range of 65/35 to 25/75, more preferably 60/40 to 35/65. If this weight ratio is smaller than 10/90, a cured product having flexibility will not be obtained by photo-curing. On the other hand, if this weight ratio is more than 80/20, the tear resistance and elastic recovery properties of a cured product obtained by photo-curing will deteriorate with the result that, when deforming stress is applied from outside and then removed, the cured product does not restore its original shape. In addition, the viscosity of the photocurable resin composition is too high with a result that handling properties, moldability and shapability deteriorate. As a result, when it is used in an optical stereolithography in particular, an intended stereolithographed object cannot be produced smoothly.

The photocurable resin composition of the present invention further contains a photopolymerization initiator (C).

Any photopolymerizable initiators which are used in photocurable resin compositions can be used without restriction. Preferred examples of the photopolymerization initiator usable in the photocurable resin composition of the present invention include 2,2-dimethoxy-2-phenylacetophenone, diethoxyacetophenone, acetophenone, 3-methylacetophenone, 2-hydroxymethyl-1-phenylpropane-1-one, 4'-isopropyl-2-hydroxy-2-propiophenone, 2-hydroxy-2-methyl-propiophenone, p-dimethylaminoacetophenone, p-t-butyldichloroacetophenone, p-t-butyltrichloroacetophenone, p-azidobenzalacetophenone, 1-hydroxycyclohexylphenyl ketone, benzophenone, methyl o-benzoyl benzoate, Michler's ketone, 4,4'-bisdiethylaminobenzophenone, xanthone, fluorenone, benzaldehyde, anthraquinone, triphenylamine, carbazole and the like.

When a compound having a cationic polymerizable group such as an epoxy group as well as a radical polymerizable group is used as the radical polymerizable compound (B), an optical cationic polymerization initiator may be used in conjunction with the above optical radical polymerization initiator. In this case, the optical cationic polymerization initiator is not limited to a particular kind and conventionally known ones can be used.

The amount of the photopolymerization initiator may vary according to kinds of the urethane acrylate (A), the radical polymerizable compound (B) and the photopolymerization initiator (C). Generally, the amount is preferably 0.1 to 10% by weight, more preferably 1 to 5% by weight, based on the total weight of the urethane acrylate (A) and the radical polymerizable compound (B).

The photocurable resin composition of the present invention may contain a leveling agent, surfactant, organic polymer modifier, organic plasticizer, organic or inorganic solid fine particles and the like as required in addition to the above components. Illustrative examples of the organic solid fine particles include crosslinked polystyrene-based fine particles, crosslinked polymethacrylate-based fine particles, polyethylene-based fine particles, polypropylene-based fine particles and the like. Illustrative examples of the inorganic solid fine particles include glass beads, talc fine particles, silicon oxide fine particles and the like. When organic solid fine particles and/or inorganic solid fine particles are to be contained in the photocurable resin composition of the present invention, those treated with a silane coupling agent such as aminosilane, epoxysilane or acrylsilane are preferably used because they improve the mechanical strength of a cured product obtained by photo-curing advantageously in many cases. When polyethylene-based solid fine particles and/or polypropylene-based solid fine particles treated with a silane coupling agent are to be contained in the photocurable resin composition, polyethylene-based solid fine particles and/or polypropylene-based solid fine particles containing 1 to 10% by weight of an acrylic acid-based compound are preferably used because they improve affinity for the silane coupling agent advantageously.

The viscosity of the photocurable resin composition of the present invention can be adjusted according to its application or mode of use. Generally, when the viscosity is measured using a rotary B type viscometer, it is preferably around 100 to 100,000 centipoises (cp) at normal temperature (25° C.), more preferably 300 to 50,000 cp from viewpoints of handling properties, moldability and stereolithgraphy. Particularly when the photocurable resin composition of the present invention is used for optical stereolithgraphy, the viscosity thereof at normal temperature is preferably in the range of 300 to 5,000 cp because excellent handling properties are obtained in the optical production of a stereolithographed object and an intended stereolithographed object can be produced at a high dimensional accuracy. The viscosity of the photocurable resin composition can be adjusted by selecting kinds of the urethane acrylate (A) and the radical polymerizable compound (B) and controlling the blend ratio thereof.

When the photocurable resin composition of the present invention is preserved under the conditions capable of shutting out light, it can be generally preserved over an extended period of about 6 to 18 months at a temperature of 10 to 40° C. while its good photo-curing properties are maintained and its modification and polymerization are prevented.

The photocurable resin composition of the present invention can be used for various applications making use of its characteristic features that it can provide moldings, stereolithographed objects and other cured products having excellent dimensional accuracy with a small volume shrinkage factor and excellent flexibility, elastic recovery and mechanical properties when it is photo-cured. For example, it can be used in the production of stereolithographed objects by an optical stereolithography, the production of various moldings such as film products and mold products by a flow cast molding method or casting, coating, vacuum casting molds and the like.

Of these, the photocurable resin composition of the present invention is the most suitable for use in the above optical stereolithography. In this case, stereolithographed objects having excellent dimensional accuracy, flexibility, elastic recovery and mechanical properties can be produced smoothly while keeping a small volume shrinkage factor at the time of photo-curing.

For optical stereolithography using the photocurable resin composition of the present invention, any conventionally known optical stereolithographic methods and devices can be used.

According to the present invention, as a particularly preferred method, there is provided a method for production of a stereolithographed object, which comprises the steps of:

irradiating a layer of the photocurable resin composition of the present invention with an active energy light selectively to form a first cured layer having a desired pattern, forming then a layer of the photocurable resin composition of the present invention on the above first cured layer, irradiating the layer with an active energy light selectively to form a second cured layer having a desired pattern, the second layer being integrated with the first cured layer, forming a third cured layer integrated with the second cured layer, and repeating this procedure until a desired stereolithographed object is formed.

Active energy lights generated from an Ar laser, He—Cd laser, xenon lamp, metal halide lamp, mercury lamp and fluorescent lamp are preferably used as optical energy for curing the resin in the present invention. A laser beam is particularly preferred. When a laser beam is used as an active energy light, it is possible to shorten the shaping time by increasing energy level and yet to obtain a stereolithographed object having a high shaping accuracy by utilizing the high convergence of the laser beam.

The thus obtained stereolithographed object may be used directly, or post-cured by irradiation or by heat to further improve mechanical properties and shape stability thereof as the case may be.

The structure, shape and size of the stereolithographed object are not particularly limited and can be determined according to each application purpose. Typical application fields of the optical stereolithography of the present invention include the production of models for verifying outer appearance in the middle of design, models for checking the functionality of parts, resin molds for fabricating casting molds, base models for fabricating molds and direct molds for fabricating mold prototypes. More specifically, the stereolithography of the present invention can be used for the production of models and processing models for precision parts, electric and electronic parts, furniture, buildings, auto parts, containers, castings, molds and mother dies. Particularly, the stereolithographed object of the present invention can be used very effectively for such fields as cushion materials having a complex shape of structures, vacuum casting molds and the like, making use of its characteristic properties such as flexibility and elastic recovery properties.

According to the present invention, therefore, there is provided a vacuum casting mold which is formed from the photocurable resin composition of the present invention by an optical stereolithography.

The photocurable resin composition of the present invention for forming the vacuum casting mold preferably contains a thermally coherent polymer material in addition to the above-described urethane acrylate (A), radical polymerizable compound (B) and photopolymerization initiator (C).

The thermally coherent polymer material is a combination of plasticizable polymer particles and a nonvolatile liquid plasticizer. When this thermally coherent polymer material is used, thermal cohesion between the polymer particles and the liquid plasticizer contained in the vacuum casting mold can be induced by heating the obtained vacuum casting mold by post-curing, whereby a vacuum casting mold having a flexural elastic modulus at 50° C. of not more than 5 kg/mm$^2$ and excellent properties such as elastic recovery properties, flexibility and stretchability.

The above plasticizable polymer particles are polymer particles which are known as being plasticizable with a plasticizer such as a polyvinyl halide exemplified by polyvinyl chloride, polyvinylidene halide exemplified by polyvinylidene chloride, vinyl halide-vinyl acetate copolymer exemplified by a vinyl chloride-vinyl acetate copolymer, vinylidene halide-vinyl acetate copolymer exemplified by a vinylidene chloride-vinyl acetate copolymer, polyvinyl acetate or the like. The photocurable resin composition may contain one member or two or more members of these polymer particles.

The content of the polymer particles in the photocurable resin composition is generally preferably about 30 to 80% by volume, more preferably about 40 to 70% by volume, based on the total volume of the photocurable resin composition.

As the above liquid plasticizer, any known plasticizers which can plasticize the above polymer particles can be used without restriction. Illustrative examples of the plasticizer include dialkyl esters of phthalic acid such as n-dioctyl phthalate, dimethyl phthalate, diethyl phthalate, dibutyl phthalate, diheptyl phthalate and di-2-ethylhexyl phthalate; triorganoesters of phosphoric acid such as tributyl phosphate, tri-2-ethylhexyl phosphate, triphenyl phosphate and tricresyl phosphate; dialkyl esters of adipic acid such as dibutyl adipate and di-n-octyl adipate; and the like. The photocurable resin composition of the present invention may contain one or a plurality of the above plasticizers.

The content of the liquid plasticizer in the photocurable resin composition is preferably about 20 to 80% by weight, more preferably about 30 to 50% by weight, based on the weight of the above polymer particles.

The vacuum casting mold of the present invention has a flexural elastic modulus at 50° C. of not more than kg/mm$^2$, more preferably not more than 3 kg/mm$^2$, particularly preferably not more than 1 kg/mm$^2$. When vacuum casting is carried out using the vacuum casting mold of the present invention having a flexural elastic modulus at 50° C. of not more than 5 kg/mm$^2$, a molding can be easily removed from the mold by expanding the mold. And yet, since the mold restores its original state after the molding is removed therefrom, it can be used repeatedly for vacuum casting. Although the lower limit of flexural elastic modulus at 50° C. of the vacuum casting mold is not particularly limited as far as the mold is strong enough to carry out vacuum casting, it is preferably determined in consideration of handling properties and strength. If the flexural elastic modulus at 50° C. of the vacuum casting mold is more than 5 kg/mm$^2$, when it is used for vacuum casting, it will be difficult to remove a molding from the vacuum casting mold (mold release) and the mold will be broken when the molding is to be removed from the mold by force, thereby making it impossible to carry out vacuum casting smoothly.

In this case, when the tensile elongation at 25° C. of the vacuum casting mold is more than 30%, it can be advantageously removed from the vacuum casting mold more easily when a molding having a complex shape such as a rugged portion is produced.

Further, the vacuum casting mold of the present invention may or may not transmit light. When the vacuum casting mold does not transmit light, after the polymer material (polymerizable material) is injected into the mold under vacuum, it is cooled and solidified in the mold or cured by heat generated therefrom and/or external heat to change it from a liquid form to a solid form, whereby an intended molding can be obtained. When the vacuum casting mold transmits light, if the ultraviolet light transmittance thereof is more than % at a thickness of 10 mm, an ultraviolet curable resin is injected into the vacuum casting mold under vacuum and then illuminated with ultraviolet light to cure it, whereby a molding can be obtained.

The "vacuum casting mold obtained from the photocurable resin composition by an optical stereolithography" as used herein refers to a vacuum casting mold obtained by irradiating the photocurable resin composition on a working plane with light energy (light energy in a broad sense including visible rays, laser beams, ultraviolet rays, electron beams, X rays and high energy corpuscular beams or the like) under control in accordance with computer data indicative of the cross sections of the three dimensional vacuum casting mold to be produced, to cure the composition, further laminating a photocurable resin composition on the cured layer, and repeating the above irradiation-curing steps until an intended three dimensional vacuum casting mold can be obtained, or to a vacuum casting mold obtained by repeating the above irradiation-curing-lamination steps through a mask without following the above computer data, that is, so-called lithography.

The vacuum casting mold of the present invention can have a coating layer having a thickness of 5 to 1,000 μm on a molding surface thereof. The presence of this coating layer markedly improves the release properties of the mold at the time of vacuum casting and also greatly improves the durability (service life) of the mold advantageously. When the thickness of the coating layer on the molding surface of the vacuum casting mold is less than 5 μm, an effect obtained by forming the coating layer is hardly provided to the vacuum casting mold, while when the thickness is more than 1,000 μm, the release properties and service life of the vacuum casting mold are not improved any longer and the dimensional accuracy of the mold is rather apt to deteriorate.

As the coating layer formed on the molding surface of the vacuum casting mold may be a high-molecular weight organic polymer coating layer, an inorganic coating layer or a mixture thereof. An organic high-molecular weight polymer coating layer is particularly preferred because it can be formed relatively easily.

The organic high-molecular weight polymer coating layer is formed from a polyimide resin, polyamide imide resin, polyimide resin, polyacrylic resin, polyurethane resin, silicon resin, fluororesin, epoxy resin, polystyrene resin, urethane acrylate resin, fluorine-based acrylic resin or the like. Other examples include resin components which as such are liquid (such as polyamide imide resin precursors, polyimide resin precursors and silicon resins) and resins which are soluble in a solvent having a relatively low boiling point [such as polyurethane resins, polystyrene resins, fluorine-based acrylic resins (meth)acrylic resins and the like]. When a fluorine-based acrylic resin such as a perfluorooctyl acrylate/perfluoroisopropyl acrylate/methyl methacrylate copolymer or an urethane acryl resin out of the above polymers is used, a coating layer having excellent release properties and adhesion to the molding surface of a mold is formed.

To maintain the ultraviolet light transmission of the vacuum casting mold, a coating layer to be formed on the molding surface of the vacuum casting mold may be formed from an ultraviolet transmitting resin such as a polyamide resin, polyamide imide resin, polyimide resin, polyacrylic resin, polyurethane resin, silicon resin, fluororesin, epoxy resin, polystyrene resin or the like.

The inorganic coating layer formed on the molding surface of the vacuum casting mold is a coating layer formed from a metal such as chromium, nickel, iron, zirconium or the like, a coating layer formed from a metal alloy, a coating layer made from an oxide of the above metal, or the like. The inorganic coating layer can be generally formed on the molding surface of the vacuum casting mold by plating, flame spray coating or vapor deposition.

The shape and size of the vacuum casting mold of the present invention are not particularly limited and can be suitably determined according to kind and use of a molding to be produced by vacuum casting.

After the vacuum casting mold of the present invention has been produced by optical shaping and post-cured as the case may be, it is machined as required to form a gate hole for injecting a liquid polymer material into the mold or a hole for attaching a fastening means such as a bolt for fixing the mold.

According to studies conducted by the inventors of the present invention, it has been revealed that a mold formed by an optical shaping method and having properties equivalent to those of the vacuum casting mold, provided by the present invention, having a flexural elastic modulus at 50° C. of not more than 5 kg/mm$^2$, for example, can be provided without using the photocurable resin composition of the present invention.

Other photocurable resin compositions which can be used in place of the photocurable resin composition of the present invention include any conventionally known liquid photocurable resin compositions which contain a photopolymerizable compound as a main component and a photopolymerization initiator and can be used by optical shaping technology. These photocurable resin compositions are not particularly limited and may contain the above-described thermally coherent polymer materiel. These photocurable resin compositions include acrylate-based photocurable resin compositions, urethane acrylate-based photocurable resin compositions, epoxy-based photocurable resin compositions, epoxy acrylate-based photocurable resin compositions, vinyl ether-based photocurable resin compositions and the like. The photocurable resin compositions are exemplified as follows.

(1) Examples of the acrylate-based photocurable resin compositions include radical polymerization type liquid photocurable resin compositions comprising a monofunctional or polyfunctional polyester (meth)acrylate or polyether (meth)acrylate as a main component, a monofunctional (meth)acrylate monomer or polyfunctional (meth)acrylate monomer as required and an optical radical polymerization initiator.

(2) Examples of the epoxy acrylate-based photocurable resin compositions include liquid photocurable resin compositions comprising a monofunctional or polyfunctional epoxy (meth)acrylate as a main component, a monofunctional (meth)acrylate monomer or polyfunctional (meth)acrylate monomer as required, an optical radical polymerization initiator, and an optical cationic polymerization initiator as required.

(3) Examples of the urethane acrylate-based photocurable resin compositions include radical polymerization type liquid photocurable resin compositions comprising a monofunctional or polyfunctional urethane (meth)acrylate as a main component, a monofunctional (meth)acrylate monomer or polyfunctional (meth)acrylate monomer as required, and an optical radical polymerization initiator.

(4) Examples of the epoxy-based photocurable resin compositions include liquid photocurable resin compositions comprising at least one member of aliphatic diepoxy compounds, alicyclic diepoxy compounds and aromatic diepoxy compounds as a main component, a monofunctional (meth)acrylate monomer or polyfunctional (meth)acrylate monomer as required, an optical cationic polymerization initiator, and an optical radical polymerization initiator as required.

(5) Examples of the vinyl ether-based photocurable resin compositions include liquid photocurable resin compositions comprising an aliphatic divinyl ether compound, alicyclic divinyl ether compound, aromatic divinyl ether compound or the like as a main component and an optical radical polymerization initiator.

(6) Examples of mixtures of photocurable resin compositions include liquid mixtures comprising at least two of acrylate-based compounds, urethane acrylate-based compounds and epoxy acrylate-based compounds, an optical radical polymerization initiator, and an optical cationic polymerization initiator as required.

For performing vacuum casting using the vacuum casting mold of the present invention, a liquid polymer material is injected (filled) into the vacuum casting mold of the present invention in a state where the mold is placed in a vacuum atmosphere such as a vacuum vessel or vacuum chamber, and is cured or solidified to fabricate a molding. Since the liquid polymer material is filled into every corner of the mold under vacuum, a vacuum casting molding having excellent dimensional accuracy and containing almost no air bubbles can be obtained smoothly. In this case, when the vacuum casting mold is placed in a vacuum atmosphere and the liquid polymer material to be injected into the mold is deaerated by vacuum suction in advance, a molding having more excellent dimensional accuracy and less air bubbles can be obtained. A vacuum treatment (reduced pressure treatment) in a vacuum vessel or vacuum chamber where the vacuum casting mold is placed may be carried out before or after the vacuum casting mold is placed therein. Further, the degree of vacuum for vacuum casting may be suitably determined according to the application purpose of the vacuum casting mold but preferably about 0.1 to 10 mmHg.

Illustrative examples of the liquid polymer material usable for the above vacuum casting include urethane resins, urea resins, epoxy resins, unsaturated polyesters, phenol resins, curable silicone resins, curable dicyclopentadiene resins, various ultraviolet curable resins (such as ultraviolet curable resins used for optical shaping or other ultraviolet curable resins), other thermosetting resins, thermoplastic polymers which are molten, by heating, into a liquid (such as styrene-based polymers, acryl-based polymers, ethylene/vinyl acetate copolymers and vinylidene chloride-based polymers) and the like.

In the case of vacuum casting using a thermosetting resin (vacuum casting not accompanied by irradiation with ultraviolet light), the thermosetting resin is injected into the vacuum casting mold of the present invention which is placed in a vacuum atmosphere and thereafter, the resin is reacted and cured by external heat or heat generated therefrom to form a molding having a shape following the interior shape of the mold.

When a molding is to be formed using an ultraviolet light transmitting vacuum casting mold by injecting an ultraviolet curable resin into the mold under vacuum, the ultraviolet curable resin is injected into the vacuum casting mold of the present invention which is placed in a vacuum atmosphere, irradiated with ultraviolet light and then reacted and cured by external heat or heat generated therefrom as required to form a molding having a shape following the interior shape of the mold.

When a thermally molten thermoplastic polymer is to be injected into the vacuum casting mold of the present invention which is placed in a vacuum atmosphere, the thermoplastic polymer is injected into the mold and solidified by cooling to obtain a molding.

Since the vacuum casting mold of the present invention having a flexural elastic modulus at 50° C. of not more than 5 kg/mm$^2$ is excellent in such properties as flexibility, stretchability and elastic recovery properties, even a molding having a complex shape such as a rugged portion can be easily removed from the mold by expanding the mold after the molding is cured or solidified. Since the vacuum casting mold of the present invention restores its original state after the molding is removed, it can be used again for vacuum casting.

The following examples are given to further illustrate the present invention. However, it is to be understood that the present invention is in no way limited to the following examples.

EXAMPLE 1

Production of First Urethane Acrylate (1) 400 Grams of 2-hydroxyethyl acrylate and 1,572 g of 6-caprolactone were charged to a 4-liter four-necked flask equipped with a stirrer, a thermoregulator, a thermometer and a condenser, and allowed to react with each other under agitation at 100 to 150° C. for 8 hours to prepare an addition product of the above formula (iii) [a compound of the formula (iii) wherein R$^1$ is hydrogen, a is 1, b is 5 and c is 4].

(2) 1,976 Grams of the addition product obtained in the above step (1), 0.998 g of hydroquinone monomethyl ether, 0.68 g of di-n-butyltin dilaurate and 320 g of isophorone diisocyanate were charged to a 4-liter four-necked flask equipped with a stirrer, a thermoregulator, a thermometer and a condenser, separately from the flask used in the above step (1), allowed to react with one another at 40 to 50° C. for 30 minutes and then further reacted at 80 to 90° C. As a result, an achromatic liquid product which was viscous at normal temperature (25° C.) was obtained.

(3) When the chemical structure of the product obtained in the above step (2) was determined, it was found from the NMR measurement that the product had absorptions ascribed to lactone at 1.3839 ppm, 1.6414 ppm, 1.6539 ppm, 2.3055 ppm and 4.0505 ppm, a multiplet absorption ascribed to isophorone group at 0.8 to 1.8 ppm and absorption ascribed to acrylate double bond at 5.8 to 6.5 ppm. Further, IR measurement showed that characteristic absorptions based on urethane bond was observed at 1,700 cm$^{-1}$ and 1,540 cm$^{-1}$. Therefore, it was confirmed that the product was the first urethane acrylate of the formula (1) [a compound of the formula (1) wherein R$^1$ is a hydrogen atom, A$^1$ is an isophorone group, a is 1, b is 5, c is 4 and d is 2]. This product is referred to as "first urethane acrylate (I$_1$)" hereinafter.

EXAMPLE 2

Production of First Urethane Acrylate 1,972 Grams of the addition product obtained in the above step (1) of Example 1, 0.44 g of hydroquinone monomethyl ether, 0.67 g of di-n-butyltin dilaurate and 250 g of tolylene diisocyanate were charged to a 4-liter four-necked flask equipped with a stirrer, a thermoregulator, a thermometer and a condenser, allowed to react with one another at 40 to 50° C. for 30 minutes and then the reaction was further continued at 80 to 90° C. As a result, an achromatic liquid product which was viscous at normal temperature (25° C.) was obtained [a compound of the formula (1) wherein R$^1$ is a hydrogen atom, A$^1$ is a tolylene group, a is 1, b is 5, c is 4 and d is 2]. This product is referred to as "first urethane acrylate (I$_2$)" hereinafter.

EXAMPLE 3

Production of First Urethane Acrylate (1) 400 Grams of 2-hydroxyethyl acrylate and 2,359 g of ε-caprolactone were charged to a 4-liter four-necked flask equipped with a stirrer, a thermoregulator, a thermometer and a condenser, and allowed to react with each other under agitation at 100 to 150° C. for 8 hours to prepare an addition product of the above formula (iii) [a compound of the formula (iii) wherein R$^1$ is a hydrogen atom, a is 1, b is 5 and c is 6].

(2) 2,819 Grams of the addition product obtained in the above step (1), 0.63 g of hydroquinone monomethyl ether, 0.94 g of di-n-butyltin dilaurate and 326 g of isophorone diisocyanate were charged to a 4-liter four-necked flask equipped with a stirrer, a thermoregulator, a thermometer and a condenser, separately from the flask used in the above step (1), allowed to react with one another at 40 to 50° C. for 30 minutes and then further reacted at 80 to 90° C. to produce the first urethane acrylate of the above formula (1) [a compound of the formula (1) wherein $R^1$ is a hydrogen atom, $A^1$ is an isophorone group, a is 1, b is 5, c is 6 and d is 2]. This product is referred to as "first urethane acrylate ($I_3$)" hereinafter].

EXAMPLE 4

Production of Second Urethane Acrylate 14.92 Grams of an addition product of 2-hydroxyethyl acrylate with propylene oxide [BLENMAR 10APE-550B of Nippon Oil and Fats Co. Ltd.; a compound of the formula (vi) wherein $R^2$ is H, $R^3$ is $CH_3$, e is 1 and f is 9], 0.63 g of hydroquinone monomethyl ether, 0.51 g of di-n-butyltin dilaurate and 222 g of isophorone diisocyanate were charged to a 4-liter four-necked flask equipped with a stirrer, a thermoregulator, a thermometer and a condenser, allowed to react with one another at 40 to 50° C. for 30 minutes and then the reaction was further continued at 80 to 90° C. to produce the second urethane acrylate [a compound of the formula (2) wherein $R^2$ is H, $R^3$ is $CH_3$, $A^2$ is an isophorone group, e is 1, f is 9 and g is 2].

EXAMPLE 5

Production of Third Urethane Acrylate 1,517 Grams of an addition product of acrylic acid with propylene oxide [BLENMAR AP-550 of Nippon Oil and Fats Co. Ltd.; a compound of the formula (vii) wherein $R^4$ is H, $R^5$ is $CH_3$ and h is 10], 1.00 g of hydroquinone monomethyl ether, 0.52 g of di-n-butyltin dilaurate and 222 g of isophorone diisocyanate were charged to a 4-liter four-necked flask equipped with a stirrer, a thermoregulator, a thermometer and a condenser, allowed to react with one another at 40 to 50° C. for 30 minutes and then the reaction was further continued at 80 to 90° C. to produce the third urethane acrylate [a compound of the formula (3) wherein $R^4$ is H, $R^5$ is $CH_3$, $A^3$ is an isophorone group, h is 10 ad j is 2].

EXAMPLE 6

Production of Urethane Acrylate Other Than First, Second and Third Urethane Acrylates (1) 382 Grams of 2-hydroxyethyl acrylate and 751 g of ε-caprolactone were charged to a 4-liter four-necked flask equipped with a stirrer, a thermoregulator, a thermometer and a condenser, and allowed to react with each other under agitation at 100 to 150° C. for 8 hours to prepare a compound having a structure similar to that of an addition product of the formula (iii) [when represented by the above formula (iii), a compound of the formula (iii) wherein $R^1$ is a hydrogen atom, a is 1, b is 5 and c is 2].

(2) 1,133 Grams of the addition product obtained in the above step (1), 0.28 g of hydroquinone monomethyl ether, 0.43 g of di-n-butyltin dilaurate and 305 g of isophorone diisocyanate were charged to a 4-liter four-necked flask equipped with a stirrer, a thermoregulator, a thermometer and a condenser, separately from the flask used in the above step (1), allowed to react with one another at 40 to 50° C. for 30 minutes and then further reacted at 80 to 90° C. As a result, an achromatic liquid product which was viscous at normal temperature (25° C.) was obtained [when represented by the above formula (1), a compound of the formula 1 wherein $R^1$ is a hydrogen atom, $A^1$ is an isophorone group, a is 1, b is 5, c is 2 and d is 2, and not included in any of the first, second and third urethane acrylates of the present invention].

EXAMPLE 7

Production of Urethane Acrylate Other Than First, Second and Third Urethane Acrylates (1) 116 Grams of 2-hydroxyethyl acrylate and 1,710 g of ε-caprolactone were charged to a 4-liter four-necked flask equipped with a stirrer, a thermoregulator, a thermometer and a condenser, and allowed to react with each other under agitation at 100 to 150° C. for 8 hours to prepare a compound having a structure similar to that of an addition product of the formula (iii) [when represented by the above formula (iii), a compound of the formula (iii) wherein $R^1$ is a hydrogen atom, a is 1, b is 5 and c is 15].

(2) 1,826 Grams of the addition product obtained in the above step (1), 0.38 g of hydroquinone monomethyl ether, 0.58 g of di-n-butyltin dilaurate and 93 g of isophorone diisocyanate were charged to a 4-liter four-necked flask equipped with a stirrer, a thermoregulator, a thermometer and a condenser, separately from the flask used in the above step (1), allowed to react with one another at 40 to 50° C. for 30 minutes and then the reaction was further continued at 80 to 90° C. As a result, an achromatic liquid product which was viscous at normal temperature (25° C.) was obtained [when represented by the above formula (1), a compound of the formula (1) wherein $R^1$ is a hydrogen atom, $A^1$ is an isophorone group, a is 1, b is 5, c is 15 and d is 2, and not included in any of the first, second and third urethane acrylates of the present invention].

EXAMPLE 8

Preparation of Photocurable Resin Composition 1,300 Grams of the first urethane acrylate ($I_1$) obtained in Example 1 and 1,200 g of morpholine acrylamide (NK Ester A-MO of Shin Nakamura Chemical Co. Ltd.) were charged into a 5-liter three-necked flask equipped with a stirrer, a cooling pipe and a dropping funnel with a bypass and the inside of the flask was depressurized, deaerated and substituted with nitrogen gas. Thereafter, 120 g of 2,2-dimethoxy-2-phenylacetophenone (Irgacure 651 of Ciba Geigy Co. Ltd.; optical radical polymerization initiator) was added to the flask under ultraviolet light-protected environment and the resulting mixture was mixed under stirring at 25° C. for about 1 hour until it was completely dissolved (mixing-under-stirring time of about 1 hour) to obtain a photocurable resin composition containing the first urethane acrylate ($I_1$), which was an achromatic transparent viscous liquid (viscosity at normal temperature of about 390 cp).

EXAMPLE 9

Preparation of Photocurable Resin Composition

The procedure in Example 8 was repeated except that 1,300 g of the first urethane acrylate ($I_2$) obtained in Example 2 was used as the urethane acrylate to obtain a photocurable resin composition containing the first urethane acrylate ($I_2$), which was an achromatic transparent viscous liquid (viscosity at normal temperature of about 430 cp).

EXAMPLE 10

Preparation of Photocurable Resin Composition

The procedure in Example 8 was repeated except that 1,300 g of the first urethane acrylate ($I_3$) obtained in Example 3 was used as the urethane acrylate to obtain a photocurable resin composition containing the first urethane acrylate (I₃), which was an achromatic transparent viscous liquid (viscosity at normal temperature of about 600 cp).

EXAMPLE 11

Preparation of Photocurable Resin Composition 1,300 Grams of the second urethane acrylate obtained in Example 4 and 1,200 g of the same morpholine acrylamide as used in Example 8 were charged into a 5-liter three-necked flask equipped with a stirrer, a cooling pipe and a dropping funnel with a bypass and the inside of the flask was depressurized, deaerated and substituted with nitrogen gas. Thereafter, 120 g of the same 2,2-dimethoxy-2-phenylacetophenone (optical radical polymerization initiator) as used in Example 8 was charged to the flask under ultraviolet light-protected environment and the resulting mixture was mixed under stirring at 25° C. until it was completely dissolved (mixing-under-stirring time of about 1 hour) to obtain an achromatic transparent viscous liquid photocurable resin composition containing the second urethane acrylate (viscosity at normal temperature of about 430 cp).

EXAMPLE 12

Preparation of Photocurable Resin Composition

The procedure in Example 11 was repeated except that 1,300 g of the third urethane acrylate obtained in Example 5 was used in place of the second urethane acrylate to obtain a photocurable resin composition containing the third urethane acrylate, which was an achromatic transparent viscous liquid (viscosity at normal temperature of about 380 cp).

COMPARATIVE EXAMPLE 1

Preparation of Photocurable Resin Composition

A photocurable resin composition was prepared in the same manner as in Example 8 except that 1,300 g of the urethane acrylate obtained in Example 6 was used in place of the first urethane acrylate (I₁) used in Example 8. The photocurable resin composition was an achromatic transparent viscous liquid (viscosity at normal temperature of about 400 cp).

COMPARATIVE EXAMPLE 2

Preparation of Photocurable Resin Composition

A photocurable resin composition was prepared in the same manner as in Example 8 except that 1,300 g of the urethane acrylate obtained in Example 7 was used in place of the first urethane acrylate (I1) used in Example 8. The photocurable resin composition was a thick paste and had no flowability.

EXAMPLE 13

Production of Photo-Cured Molding by Molding-by-Mold Method (1) The photocurable resin composition containing the first urethane acrylate (I₁) prepared in the above Example 8 was injected into a transparent silicon mold having a dumbbell-shaped cavity which conformed with JIS 7113 and then irradiated with ultraviolet light from a 30W ultraviolet lamp from the entire surface of the silicon mold for 15 minutes to cure it. Thus, a photo-cured dumbbell-shaped test sample molding was produced. When the molding (dumbbell-shaped test sample) was taken out from the mold and measured for its tensile properties (tensile strength, tensile elongation and tensile modulus) in accordance with JIS K 7113, the results shown in Table 1 were obtained.

(2) When the elastic recovery properties of the dumbbell-shaped test sample obtained in (1) above was evaluated as follows, the result shown in Table 1 was obtained.

Evaluation of elastic recovery properties of dumbbell-shaped test sample

The dumbbell-shaped test sample (molding or stereolithographed object) was completely folded in two by hand at a central portion thereof in a longitudinal direction and kept the folded state for 10 minutes and then, was released from this folded state. The test sample was evaluated as good (○) when it restored its original flat dumbbell shape and as bad (×) when it did not restore its original flat dumbbell shape and the folded state still remained or could not be bent.

(3) Further, the volume shrinkage factor (%) of the dumbbell-shaped test sample was obtained from the following equation (4) by measuring the specific gravity ($d_1$) before photo-curing of the photocurable resin composition used in the molding of Example 13 and the specific gravity ($d_2$) of the molding (dumbbell-shaped test sample) obtained. The result is shown in Table 1 below.

$$\text{volume shrinkage factor (\%)} = (d_1/d_2) \times 100 \quad (4)$$

EXAMPLE 14

Production of Stereolithographed Object by Optical Stereolithography

Optical stereolithography was carried out using the photocurable resin composition containing the first urethane acrylate (I₁) obtained in above Example 8 and an ultra high-speed optical shaping system (SOLIFORM500, a product of Teijin Seiki Co., Ltd.) by irradiating the resin composition with light from a water-cooled Ar laser (output of 500 mW; wavelengths of 333, 354 and 364 nm), at an irradiation energy of 20 to 30 mJ/cm², at a slice pitch (thickness of each layer) of 0.127 mm and an average shaping time per layer of 2 min. Thus, a dumbbell-shaped stereolithographed object based on JIS 7113 was produced. The thus obtained stereolithographed object was cleaned with isopropyl alcohol to remove an uncured resin solution adhered to the stereolithographed object and then, irradiated with 3 KW ultraviolet light for 10 minutes to post-cure the resin. The resulting stereolithographed object (dumbbell-shaped test sample) was measured for its tensile properties (tensile strength, tensile elongation and tensile modulus) in accordance with JIS K 7113. The results are shown in Table 1.

The elastic recovery properties of the thus obtained dumbbell-shaped test sample (stereolithographed object) after post-curing was evaluated in the same manner as in Example 13. The result is shown in Table 1.

Further, the volume shrinkage factor (%) of the dumbbell-shaped test sample was obtained from the above equation (4) by measuring the specific gravity ($d_1$) before photo-curing of the photocurable resin composition used in the stereolithography of Example 14 and the specific gravity ($d_2$) of the stereolithographed object after post-curing. The result is shown in Table 1.

EXAMPLE 15

Production of Stereolithographed Object by Optical Stereolithography

Optical stereolithography, cleaning of an uncured resin and post-curing were carried out in the same manner as in Example 14 except that the photocurable resin composition containing the first urethane acrylate (I2) obtained in above Example 9 was used to produce a stereolithographed object (dumbbell-shaped test sample). The tensile properties, elastic recovery properties and volume shrinkage factor of the thus obtained dumbbell-shaped test sample (stereolithographed object) were measured or evaluated in the same manner as in Example 14. The results are shown in Table 1.

EXAMPLE 16

Production of Stereolithographed Object by Optical Stereolithography

Optical stereolithography, cleaning of an uncured resin and post-curing were carried out in the same manner as in Example 14 except that the photocurable resin composition containing the first urethane acrylate (I3) obtained in above Example 10 was used to produce a stereolithographed object (dumbbell-shaped test sample). The tensile properties, elastic recovery properties and volume shrinkage factor of the thus obtained dumbbell-shaped test sample (stereolithographed object) were measured or evaluated in the same manner as in Example 14. The results are shown in Table 1.

EXAMPLE 17

Production of Photo-Cured Molding by Molding-by-Mold Method

The photocurable resin composition containing the second urethane acrylate obtained in above Example 11 was injected into a transparent silicon mold having a dumbbell-shaped cavity which conformed with JIS 7113 in the same manner as in Example 13 and photo-cured in the same manner as in Example 13 to produce a dumbbell-shaped molding. The tensile properties, elastic recovery properties and volume shrinkage factor of the thus obtained dumbbell-shaped test sample (molding) were obtained in the same manner as in Example 13. The results are shown in Table 1.

EXAMPLE 18

Production of Stereolithographed Object by Optical Stereolithography

Optical stereolithography, cleaning of an uncured resin and post-curing were carried out in the same manner as in Example 14 except that the photocurable resin composition containing the second urethane acrylate obtained in above Example 11 was used to produce a stereolithographed object (dumbbell-shaped test sample). The tensile properties, elastic recovery properties and volume shrinkage factor of the thus obtained dumbbell-shaped test sample (stereolithographed object) were measured or evaluated in the same manner as in Example 14. The results are shown in Table 1.

EXAMPLE 19

Production of Photo-Cured Molding by Molding-by-Mold Method

The photocurable resin composition containing the third urethane acrylate obtained in above Example 12 was injected into a transparent silicon mold having a dumbbell-shaped cavity which conformed with JIS 7113 in the same manner as in Example 13 and photo-cured in the same manner as in Example 13 to produce a dumbbell-shaped molding. The tensile properties, elastic recovery properties and volume shrinkage factor of the thus obtained dumbbell-shaped test sample (molding) were obtained in the same manner as in Example 13. The results are shown in Table 1.

EXAMPLE 20

Production of Stereolithographed Object by Optical Stereolithography

Optical stereolithography, cleaning of an uncured resin and post-curing were carried out in the same manner as in Example 14 except that the photocurable resin composition containing the third urethane acrylate obtained in above Example 12 was used to produce a stereolithographed object (dumbbell-shaped test sample). The tensile properties, elastic recovery properties and volume shrinkage factor of the thus obtained dumbbell-shaped test sample (stereolithographed object) were measured or evaluated in the same manner as in Example 14. The results are shown in Table 1.

COMPARATIVE EXAMPLE 3

Production of Stereolithographed Object by Optical Stereolithography

Optical stereolithography, cleaning of an uncured resin and post-curing were carried out in the same manner as in Example 14 except that the photocurable resin composition obtained in above Comparative Example 1 was used to produce a stereolithographed object (dumbbell-shaped test sample). The tensile properties, elastic recovery properties and volume shrinkage factor of the thus obtained dumbbell-shaped test sample (stereolithographed object) were measured or evaluated in the same manner as in Example 14. The results are shown in Table 1.

COMPARATIVE EXAMPLE 4

Production of Photo-Cured Molding by Molding-by-Mold Method

The thick pasty photocurable resin composition obtained in above Comparative Example 2 was filled into a transparent silicon mold having a dumbbell-shaped cavity which conformed with JIS 7113 in the same manner as in Example 13 and photo-cured in the same manner as in Example 13 to produce a dumbbell-shaped molding. The tensile properties, elastic recovery properties and volume shrinkage factor of the thus obtained dumbbell-shaped test sample (molding) were obtained in the same manner as in Example 13. The results are shown in Table 1.

TABLE 1

|  | Photocurable resin composition [kind of UA[1)]] | Production method | Dumbbell-shaped test sample (photocured product) | | | | Volume shrinkage factor (%) |
|---|---|---|---|---|---|---|---|
|  |  |  | Tensile strength (kg/mm$^2$) | Tensile elongation (%) | Tensile elastic modulus (kg/mm$^2$) | Elastic recovery properties |  |
| Ex. 13 | Ex. 8 [UA(1)] | Molding by mold | 1.2 | 108 | 1.3 | ◯ | 6.4 |
| Ex. 14 | Ex. 8 [UA(1)] | Stereolithography | 0.8 | 98 | 1.5 | ◯ | 6.2 |
| Ex. 15 | Ex. 9 [UA(1)] | Stereolithography | 0.9 | 94 | 3.2 | ◯ | 6.0 |
| Ex. 16 | Ex. 10 [UA(1)] | Stereolithography | 0.3 | 74 | 0.5 | ◯ | 5.7 |
| Ex. 17 | Ex. 11 [UA(2)] | Molding by mold | 0.5 | 98 | 0.8 | ◯ | 5.5 |
| Ex. 18 | Ex. 11 [UA(2)] | Stereolithography | 0.4 | 93 | 0.5 | ◯ | 4.7 |
| Ex. 19 | Ex. 12 [UA(3)] | Molding by mold | 0.4 | 107 | 0.6 | ◯ | 5.2 |
| Ex. 20 | Ex. 12 [UA(3)] | Stereolithography | 0.3 | 94 | 0.7 | ◯ | 4.9 |
| Comp. Ex. 3 | Comp. Ex. 1 [other UA] | Stereolithography | 2.3 | 4 | 120 | X[2)] | 7.7 |
| Comp. Ex. 4 | Comp. Ex. 2 [other UA] | Molding by mold | 0.2 | 2 | 0.3 | X[3)] | 6.5 |

Ex.: Example, Comp. Ex.: Comparative Example
[1)]Kind of UA (kind of an urethane acrylate compound contained the photocurable resin composition)
UA(1): first urethane acrylate, UA(2): second urethane acrylate, UA(3): third urethane acrylate, other UA: an urethane acrylate other than the first, second and third urethane acrylates
[2)]It was extremely difficult to bend and the test sample was broken when it was bent by force.
[3)]It was difficult to bend and the test sample did not restore its original shape in 10 minutes when it was bent by force.

It is understood from the results of Table 1 above that high-quality moldings and stereolithographed objects having high tensile elongation and excellent flexibility, elastic recovery properties and tensile strength are obtained at a high dimensional accuracy with a small volume shrinkage factor in Examples 13 to which use the photocurable resin compositions of Examples 8 to 12 containing the urethane acrylates of the present invention.

In contrast, it is also understood that the stereolithographed object obtained in Comparative Example 3 which uses the photocurable resin composition of Comparative Example 1 containing an urethane acrylate which is different from the urethane acrylates of the present invention has no flexibility with an extremely small tensile elongation and a high volume shrinkage factor, and is hard and fragile.

Further, it is also evident from the results of Comparative Examples 2 and 4 that the photocurable resin composition of Comparative Example 2 containing an urethane acrylate which is different from the urethane acrylates of the present invention is not a liquid because of its extremely high viscosity, is hardly molded by a molding-by mold method and cannot be used in the optical stereolithography and yet a molding obtained from the photocurable resin composition of Comparative Example 2 has no flexibility with an extremely small tensile elongation and is fragile with a low tensile modulus.

EXAMPLE 21

(1) A vacuum casting mold consisting of a core mold 1 and a cavity mold 2 having shapes shown in FIG. 1 was produced from the photocurable resin composition obtained in Example 8 using an ultra high-speed optical shaping system (SOLIFORM500, a product of Teijin Seiki Co., Ltd.) by irradiating the resin composition with light from a water-cooled Ar laser (output of 500 mW; wavelengths of 333, 351 and 364 nm) at an irradiation energy of 20 to 30 mJ/cm$^2$, at a slice pitch (thickness of each layer) of 0.05 mm and an average shaping time per layer of 2 minutes. The thus obtained vacuum casting mold was cleaned with isopropyl alcohol to remove an uncured resin solution adhered to the mold and irradiated with 3 KW ultraviolet light for 10 minutes to post-cure the resin at 150° C. for 30 minutes.

Figure 2:
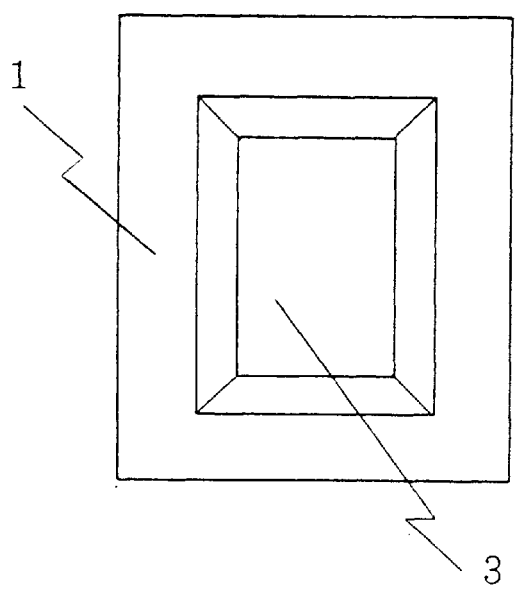
FIG. 2 is a schematic plan view seen from a molding surface of a core mold of the mold of FIG. 1.
Figure 3:
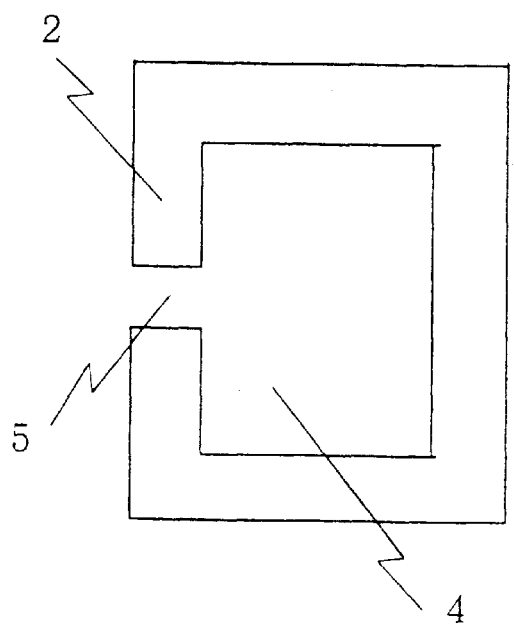
FIG. 3 is a schematic plan view seen from a molding surface of a cavity mold of the mold of FIG. 1.

FIG. 1 is a sectional view cut at a right angle to the parting surface of the vacuum casting mold, FIG. 2 is a plan view seen from the molding surface of the core mold 1, and FIG. 3 is a plan view seen from the molding surface of the cavity mold 2. In FIG. 1, reference numeral 3 denotes a core portion of the core mold, 4 a cavity portion of the cavity mold 2, and 5 a gate for injecting a liquid polymer material into the vacuum casting mold.

(2) The vacuum casting mold obtained in the above step (1) was placed in a vacuum vessel which was maintained at a temperature of 50° C. and a pressure of 5 mmHg, and a two-pack type liquid urethane resin (Colonate 4090, a product of Nippon Polyurethane Co. Ltd.) was injected into the vacuum casting mold and allowed to react for 60 minutes to form a polyurethane molding in the mold. Thereafter, the polyurethane molding was taken out from the vacuum vessel together with the vacuum casting mold and removed from the mold by expanding the vacuum casting mold while the temperature of the polyurethane molding was between 50 and 60° C. Since the vacuum casting mold was excellent in flexibility and stretchability, the polyurethane molding could be removed from the vacuum casting mold smoothly. In addition, the vacuum casting mold after the polyurethane molding was removed therefrom restored its original shape due to its excellent elastic recovery properties and could be reused for vacuum casting. Therefore, when the same vacuum casting as described above was repeated until the vacuum casting mold underwent breakage, it could be carried out seven times and seven polyurethane moldings were obtained.

(3) Using the same ultra-high speed optical shaping system as in the above step (1), optical shaping was carried out under the same conditions as in the above step (1) to produce a dumbbell-shaped test sample based on JIS 7113. The dumbbell-shaped test sample was cleaned with isopropyl alcohol to remove an uncured resin solution adhered to the dumbbell-shaped test sample, irradiated with 3 KW ultraviolet light for 10 minutes and further heated at 150° C. for 30 minutes to post-cure the resin. The tensile properties (tensile strength, tensile elongation and tensile modulus) of the thus obtained dumbbell-shaped test sample were measured in accordance with JIS K 7113. The results are shown in Table 2.

Further, when the dumbbell-shaped test sample after post-curing was measured for a flexural elastic modulus at 50° C. in accordance with JIS K 7207, the result shown in Table 2 was obtained.

EXAMPLE 22

(1) Optical shaping was carried out in the same manner as in (1) of Example 21 using the photocurable resin composition obtained in Example 9 to produce a vacuum casting mold consisting of a core mold 1 and a cavity mold 2 having shapes shown in FIG. 1. Thereafter, the thus obtained vacuum casting mold was cleaned with isopropyl alcohol and then, subjected to the irradiation with ultraviolet light and heat-treatment in the same manner as in (1) of Example 21 to be post-cured. (2) A polyurethane molding was produced by vacuum casting in the same manner as in (2) of Example 21 using the vacuum casting mold obtained in the above step (1). Thereafter, the polyurethane molding was taken out from the vacuum vessel together with the vacuum casting mold and taken out from the mold by expanding the vacuum casting mold while the temperature of the polyurethane molding was between 50 and 60° C. Since the vacuum casting mold was excellent in flexibility and stretchability, the polyurethane molding could be taken out from the vacuum casting mold smoothly. In addition, the vacuum casting mold after the polyurethane molding was removed therefrom restored its original shape due to its excellent elastic recovery properties and could be reused for vacuum casting. Therefore, when the same vacuum casting as described above was repeated until the vacuum casting mold was broken, it could be carried out five times and five polyurethane moldings were obtained. (3) Optical shaping was carried out in the same manner as in (3) of Example 21 to produce a dumbbell-shaped test sample based on JIS 7113. The dumbbell-shaped test sample was cleaned with isopropyl alcohol and post-cured by irradiating with ultraviolet light and heating in the same manner as in (3) of Example 21. The tensile properties (tensile strength, tensile elongation and tensile modulus) of the thus obtained dumbbell-shaped test sample were measured in accordance with JIS K 7113. The results are shown in Table 2.

When the dumbbell-shaped test sample after post-curing was measured for the flexural elastic modulus at 50° C. in accordance with JIS K 7207, the result shown in Table 2 was obtained.

EXAMPLE 23

(1) Optical shaping was carried out in the same manner as in (1) of Example 21 using the photocurable resin composition obtained in Example 10 to produce a vacuum casting mold consisting of a core mold 1 and a cavity mold 2 having shapes shown in FIG. 1. Thereafter, the thus obtained vacuum casting mold was cleaned with isopropyl alcohol and then, subjected to the irradiation with ultraviolet light and heat-treatment in the same manner as in (1) of Example 21 to be post-cured. (2) A polyurethane molding was produced by vacuum casting in the same manner as in (2) of Example 21 using the vacuum casting mold obtained in the above step (1). Thereafter, the polyurethane molding was taken out from the vacuum vessel together with the vacuum casting mold and taken out from the mold by expanding the vacuum casting mold while the temperature of the polyurethane molding was between 50 and 60° C. Since the vacuum casting mold was excellent in flexibility and stretchability, the polyurethane molding could be taken out from the vacuum casting mold smoothly. In addition, the vacuum casting mold after the polyurethane molding was removed therefrom restored its original shape due to its excellent elastic recovery properties and could be reused for vacuum casting. Therefore, when the same vacuum casting as described above was repeated until the vacuum casting mold was broken, it could be carried out ten times and ten polyurethane moldings were obtained. (3) Optical shaping was carried out in the same manner as in (3) of Example 21 to produce a dumbbell-shaped test sample based on JIS 7113. The dumbbell-shaped test sample was cleaned with isopropyl alcohol and post-cured by irradiating with ultraviolet light and heating in the same manner as in (3) of Example 21. The tensile properties (tensile strength, tensile elongation and tensile modulus) of the thus obtained dumbbell-shaped test sample were measured in accordance with JIS K 7113. The results are shown in Table 2.

When the dumbbell-shaped test sample after post-curing was measured for the flexural elastic modulus at 50° C. in accordance with JIS K 7207, the result shown in Table 2 was obtained.

EXAMPLE 24

(1) Optical shaping was carried out in the same manner as in (1) of Example 21 using the photocurable resin composition obtained in Example 11 to produce a vacuum casting mold consisting of a core mold 1 and a cavity mold 2 having shapes shown in FIG. 1. Thereafter, the thus obtained vacuum casting mold was cleaned with isopropyl alcohol and then, subjected to the irradiation with ultraviolet light and heat-treatment in the same manner as in (1) of Example 21 to be post-cured. (2) A polyurethane molding was produced by vacuum casting in the same manner as in (2) of Example 21 using the vacuum casting mold obtained in the above step (1). Thereafter, the polyurethane molding was taken out from the vacuum vessel together with the vacuum casting mold and taken out from the mold by expanding the vacuum casting mold while the temperature of the polyurethane molding was between 50 and 60° C. Since the vacuum casting mold was excellent in flexibility and stretchability, the polyurethane molding could be taken out from the vacuum casting mold smoothly. In addition, the vacuum casting mold after the polyurethane molding was removed therefrom restored its original shape due to its excellent elastic recovery properties and could be reused for vacuum casting. Therefore, when the same vacuum casting as described above was repeated until the vacuum casting mold was broken, it could be carried out twelve times and twelve polyurethane moldings were obtained.

(3) Optical shaping was carried out in the same manner as in (3) of Example 21 to produce a dumbbell-shaped test sample based on JIS 7113. The dumbbell-shaped test sample was cleaned with isopropyl alcohol and post-cured by irradiating with ultraviolet light and heating in the same manner as in (3) of Example 21. The tensile properties (tensile strength, tensile elongation and tensile modulus) of the thus obtained dumbbell-shaped test sample were measured in accordance with JIS K 7113. The results are shown in Table 2.

When the dumbbell-shaped test sample after post-curing was measured for the flexural elastic modulus at 50° C. in accordance with JIS K 7207, the result shown in Table 2 was obtained.

EXAMPLE 25

(1) Optical shaping was carried out in the same manner as in (1) of Example 21 using the photocurable resin composition obtained in Example 12 to produce a vacuum casting mold consisting of a core mold 1 and a cavity mold 2 having shapes shown in FIG. 1. Thereafter, the thus obtained vacuum casting mold was cleaned with isopropyl alcohol and then, subjected to the irradiation with ultraviolet light and heat-treatment in the same manner as in (1) of Example 21 to be post-cured. (2) A polyurethane molding was produced by vacuum casting in the same manner as in (2) of Example 21 using the vacuum casting mold obtained in the above step (1). Thereafter, the polyurethane molding was taken out from the vacuum vessel together with the vacuum casting mold and taken out from the mold by expanding the vacuum casting mold while the temperature of the polyurethane molding was between 50 and 60° C. Since the vacuum casting mold was excellent in flexibility and stretchability, the polyurethane molding could be taken out from the vacuum casting mold smoothly. In addition, the vacuum casting mold after the polyurethane molding was removed therefrom restored its original shape due to its excellent elastic recovery properties and could be reused for vacuum casting. Therefore, when the same vacuum casting as described above was repeated until the vacuum casting mold was broken, it could be carried out nine times and nine polyurethane moldings were obtained. (3) Optical shaping was carried out in the same manner as in (3) of Example 21 to produce a dumbbell-shaped test sample based on JIS 7113. The dumbbell-shaped test sample was cleaned with isopropyl alcohol and post-cured by irradiating with ultraviolet light and heating in the same manner as in (3) of Example 21. The tensile properties (tensile strength, tensile elongation and tensile modulus) of the thus obtained dumbbell-shaped test sample were measured in accordance with JIS K 7113. The results are shown in Table 2.

When the dumbbell-shaped test sample after post-curing was measured for the flexural elastic modulus at 50° C. in accordance with JIS K 7207, the result shown in Table 2 was obtained.

EXAMPLE 26

(1) A photocurable resin composition (viscosity at normal temperature of about 400 cp) obtained in the same manner as in Example 8 except that 1,300 g of the urethane acrylate obtained in Example 6 was used in place of the first urethane acrylate ($I_1$) used in Example 8 was transferred to a 10-liter universal stirrer, and 7,500 g of polyvinyl chloride fine particles having an average particle size of 5 μm and 3,750 g of di-n-octyl phthalate were added and mixed under stirring for one day to obtain an opaque white viscous liquid photocurable resin composition (viscosity at normal temperature of about 5,400 cp).
(2) Optical shaping was carried out in the same manner as in (1) of Example 21 using the photocurable resin composition obtained in the above step (1) to produce a vacuum casting mold consisting of a core mold 1 and a cavity mold 2 having shapes shown in FIG. 1. Thereafter, the thus obtained vacuum casting mold was cleaned with isopropyl alcohol and then, subjected to the irradiation with ultraviolet light and heat-treatment in the same manner as in (1) of Example 21 to be post-cured. (3) A polyurethane molding was produced by vacuum casting in the same manner as in (2) of Example 21 using the vacuum casting mold obtained in the above step (1). Thereafter, the polyurethane molding was taken out from the vacuum vessel together with the vacuum casting mold and taken out from the mold by expanding the vacuum casting mold while the temperature of the polyurethane molding was between 50 and 60° C. Since the vacuum casting mold was excellent in flexibility and stretchability, the polyurethane molding could be taken out from the vacuum casting mold smoothly. In addition, the vacuum casting mold after the polyurethane molding was removed therefrom restored its original shape due to its excellent elastic recovery properties and could be reused for vacuum casting. Therefore, when the same vacuum casting as described above was repeated until the vacuum casting mold was broken, it could be carried out five times and five polyurethane moldings were obtained. (4) Optical shaping was carried out in the same manner as in (3) of Example 21 to produce a dumbbell-shaped test sample based on JIS 7113. The dumbbell-shaped test sample was cleaned with isopropyl alcohol and post-cured by irradiating with ultraviolet light and heating in the same manner as in (3) of Example 21. The tensile properties (tensile strength, tensile elongation and tensile modulus) of the thus obtained dumbbell-shaped test sample were measured in accordance with JIS K 7113. The results are shown in Table 2.

When the dumbbell-shaped test sample after post-curing was measured for the flexural elastic modulus at 50° C. in accordance with JIS K 7207, the result shown in Table 2 was obtained.

COMPARATIVE EXAMPLE 5

(1) Optical shaping was carried out in the same manner as in (1) of Example 21 using the photocurable resin composition obtained in Comparative Example 1 to produce a vacuum casting mold consisting of a core mold 1 and a cavity mold 2 having shapes shown in FIG. 1. Thereafter, the thus obtained vacuum casting mold was cleaned with isopropyl alcohol and post-cured by irradiating with ultraviolet light and heating in the same manner as in (1) of Example 21.
(2) A polyurethane molding was produced by vacuum casting in the same manner as in (2) of Example 21 using the vacuum casting mold obtained in the above step (1). Thereafter, the polyurethane molding was taken out from the vacuum vessel together with the vacuum casting mold and tried to take out from the mold by expanding the vacuum casting mold while the temperature of the polyurethane molding was between 50 and 60° C. However, since the vacuum casting mold had no flexibility and stretchability, the polyurethane molding could not be taken from the mold smoothly, and when the molding was taken out by force, the vacuum casting mold was broken. (3) Optical shaping was carried out in the same manner as in (3) of Example 21 to produce a dumbbell-shaped test sample based on JIS 7113. The dumbbell-shaped test sample was cleaned with isopropyl alcohol and post-cured by irradiating with ultraviolet light and heating in the same manner as in (3) of Example 21. The tensile properties (tensile strength, tensile elongation and tensile modulus) of the thus obtained dumbbell-shaped test sample were measured in accordance with JIS K 7113. The results are shown in Table 2.

When the obtained dumbbell-shaped test sample after post-curing was measured for the flexural elastic modulus at 50° C. in accordance with JIS K 7207, the result shown in Table 2 was obtained.

TABLE 2

| | Physical properties of optical shaped product (dumbbell-shaped test sample) | | | | |
|---|---|---|---|---|---|
| | Tensile strength (kg/mm$^2$) | Tensile elongation (%) | Tensile elastic modulus (kg/mm$^2$) | Flexural elastic modulus at 50° C. (kg/mm$^2$) | Number of times of vacuum casting |
| Ex. 21 | 0.8 | 98 | 1.5 | 0.5 | 7 |
| Ex. 22 | 0.9 | 94 | 3.2 | 1.5 | 5 |
| Ex. 23 | 0.3 | 74 | 0.5 | 0.2 | 10 |
| Ex. 24 | 0.5 | 93 | 0.5 | 0.2 | 12 |

TABLE 2-continued

| | Physical properties of optical shaped product (dumbbell-shaped test sample) | | | | |
|---|---|---|---|---|---|
| | Tensile strength (kg/mm$^2$) | Tensile elongation (%) | Tensile elastic modulus (kg/mm$^2$) | Flexural elastic modulus at 50° C. (kg/mm$^2$) | Number of times of vacuum casting |
| Ex. 25 | 0.3 | 94 | 0.7 | 0.3 | 9 |
| Ex. 26 | 0.7 | 46 | 4.8 | 2.0 | 5 |
| Comp. Ex. 5 | 2.3 | 4 | 120 | 45 | 0[1)] |

Ex.: Example
Comp. Ex.: Comparative Example
[1)]The molding could not be removed from the vacuum casting mold and a finished product could not be obtained.

It is evident from the results of Table 2 above that the vacuum casting mold of the present invention having a flexural elastic modulus at 50° C. of not more than 5 kg/mm$^2$ is excellent in flexibility, stretchability and elastic recovery properties and a molding can be therefore easily removed from the mold, and that the mold restores its original shape after the molding is taken out therefrom and can be reused.

In contrast, since the vacuum casting mold of Comparative Example 5 having a flexural elastic modulus at 50°C. of more than 5 kg/mm$^2$ is inferior in flexibility, stretchability and elastic recovery properties, a molding could not be removed (mold release) from the mold smoothly and is broken when it is removed by force.

EXAMPLE 27

(1) A solution of 30 parts by weight of a methyl methacrylate/perfluoropentyl acrylate/butyl acrylate (in a molar ratio of 6/2/2) dissolved in 70 parts by weight of a mixture solvent of methyl Cellosolve/methyl ethyl ketone/isopropyl alcohol (in a weight ratio of 60/10/30) was applied to the molding surface of the vacuum casting mold obtained in (2) of Example 21 by a spray gun and air-dried for 1 hour, and then, the vacuum casting mold was heat-treated in an oven heated at 800C for 30 minutes to have a coating layer (thickness: 30 pm) of the above copolymer on the molding surface thereof. (2) A polyurethane molding was produced by vacuum casting in the same manner as in (2) of Example 21 using the vacuum casting mold having a coating layer of a copolymer on the molding surface obtained in the above step (1). Thereafter, the polyurethane molding was taken out from the vacuum vessel together with the vacuum casting mold and taken out from the mold by expanding the vacuum casting mold while the temperature of the polyurethane molding was between 50 and 60° C. Since the vacuum casting mold was excellent in flexibility and stretchability, the polyurethane molding could be taken out from the vacuum casting mold smoothly. In addition, the vacuum casting mold after the polyurethane molding was removed therefrom restored its original shape due to its excellent elastic recovery properties and could be reused for vacuum casting. Therefore, when the same vacuum casting as described above was repeated until the vacuum casting mold was broken, it could be carried out times and 30 polyurethane moldings were obtained.

It is understood from the result of this Example 27 that the vacuum casting mold of the present invention having an organic polymer coating layer on the molding surface thereof has further improved release properties and durability and can be used for vacuum casting over a large number of times.

EXAMPLE 28

(1) A solution of 60 parts by weight of a polyurethane-based coating (Colonate L, a product of Nippon Polyurethane Co. Ltd.) dissolved in 100 parts by weight of xylene was applied to the molding surface of the vacuum casting mold obtained in (2) of Example 21 by a spray gun, and thereafter, the vacuum casting mold was heat-treated in an oven heated at 80° C. for 30 minutes and then in an oven heated at 150° C. for 30 minutes to have a polyurethane coating layer (thickness: 60 pm) on the molding surface thereof.

(2) A polyurethane molding was produced by vacuum casting in the same manner as in (2) of Example 21 using the vacuum casting mold having a polyurethane coating layer on the molding surface obtained in the above step (1). Thereafter, the polyurethane molding was taken out from the vacuum vessel together with the vacuum casting mold and taken out from the mold by expanding the vacuum casting mold while the temperature of the polyurethane molding was between 50 and 60° C. Since the vacuum casting mold was excellent in flexibility and stretchability, the polyurethane molding could be taken out from the vacuum casting mold smoothly. In addition, the vacuum casting mold after the polyurethane molding was removed therefrom restored its original shape due to its excellent elastic recovery properties and could be reused for vacuum casting. Therefore, when the same vacuum casting as described above was repeated until the vacuum casting mold was broken, it could be carried out times and 30 polyurethane moldings were obtained.

Also, it is understood from the result of this Example 28 that the vacuum casting mold of the present invention having an organic polymer coating layer on the molding surface has further improved release properties and durability and can be used for vacuum casting over a large number of times.

EXAMPLE 29

(1) Production of ultraviolet light transmitting vacuum casting mold:

(A) Using a photocurable resin composition (viscosity at normal temperature of about 390 cp) containing the first urethane acrylate compound ($I_1$) obtained in above Example 8 which was an achromatic transparent viscous liquid and using an ultra high-speed optical shaping system (SOLIFORM 500, a product of Teijin Seiki Co., Ltd.), optical shaping was carried out by irradiating the resin composition with light from a water-cooled Ar laser (output of 500 mW; wavelengths of 333, 351 and 364 nm), under an irradiation energy of 20 to 30 mJ/cm$^2$, at a slice pitch (thickness of each layer) of 0.05 mm and an average shaping time per layer of 2 minutes, whereby a vacuum casting mold (cavity/core mold) having a cavity mold corresponding to a dumbbell-shaped test sample based on JIS K 7113 was produced.

(B) The vacuum casting mold obtained in the above step (A) had a wall thickness of 10 mm, and when its ultraviolet transmittance (ultraviolet light energy of 3 KW, wavelength of 200 to 400 nm) was determined from the following equation, it was found to be 67%.

$$\text{ultraviolet light transmittance of vacuum casting mold } (\%) = (I/I_0) \times 100$$

wherein $I_0$ is the amount of ultraviolet light before passing through the vacuum casting mold and I is the amount of ultraviolet light after passing through the vacuum casting mold.

(C) A solution of 30 parts by weight of a methyl methacrylate/perfluoropentyl acrylate/butyl acrylate (in a molar ratio of 6/2/2) dissolved in 70 parts by weight of a mixture solvent of methyl Cellosolve/methyl ethyl ketone/ isopropyl alcohol (in a weight ratio of 60/10/30) was applied to the molding surface of the vacuum casting mold obtained in the above step (A) by a spray gun, air-dried for 1 hour, and the vacuum casting mold was heat-treated in an oven heated at 80° C. for 30 minutes to have a coating layer of the above copolymer (thickness: 30 pm) on the molding surface thereof.

(2) Preparation of ultraviolet curable resin: (A) 382 Grams of 2-hydroxyethyl acrylate and 751 g of ε-caprolactone were charged to a 4-liter four-necked flask equipped with a stirrer, a thermoregulator, a thermometer and a condenser and allowed to react with one another under agitation at 100 to 150° C. for 8 hours to produce an addition product of the formula (iii) wherein $R^1$ is a hydrogen atom, a is 1, b is 5 and c is 2. (B) 1,133 Grams of the addition product obtained in the above step (1), 0.28 g of hydroquinone monomethyl ether, 0.43 g of di-n-butyltin dilaurate and 305 g of isophorone diisocyanate were charged to a 4-liter four-necked flask equipped with a stirrer, a thermoregulator, a thermometer and a condenser, separately from the flask used in the above step (A), allowed to react with one another at 40 to 50° C. for 30 minutes and then further reacted at 80 to 90° C. As a result, an achromatic urethane acrylate of the formula (1) wherein $R^1$ is a hydrogen atom, $A^1$ is an isophorone group, a is 1, b is 5, c is 2 and d is 2, which was a viscous liquid at normal temperature (25° C.) was obtained.

(C) 150 Grams of the urethane acrylate obtained in the above step (B), 90 g of morpholine acrylamide (NK Ester A-MO, a product of Shin Nakamura Chemical Co., Ltd.) and 60 g of an acrylate compound shown in Table 3 below were charged into a 5-liter three-necked flask equipped with a stirrer, a cooling pipe and a dropping funnel with a bypass and the inside of the flask was depressurized, deaerated and substituted with nitrogen gas.

TABLE 3

| Abbreviation | Contents |
| --- | --- |
| AC-1 | Phenoxyethyl acrylate (MT10G of Shin Nakamura Chemical Co., Ltd.) |
| AC-2 | 4-t-Butylcyclohexyl acrylate (A-TBC of Shin Nakamura Chemical Co., Ltd.) |
| AC-3 | Methoxydiethylene glycol methacrylate (M-20 of Shin Nakamura Chemical Co., Ltd.) |
| AC-4 | Methoxypolyethylene glycol methacrylate (M-40 of Shin Nakamura Chemical Co., Ltd.) |
| AC-5 | Nonylphenoxypolyethylene glycol acrylate (NPA-5E of Shin Nakamura Chemical Co., Ltd.) |

(D) Thereafter, 9 g of 2,2-dimethoxy-2-phenylacetophenone (Irgacure 651, a product of Ciba Geigy Co., Ltd.; optical radical polymerization initiator) was charged to the flask under ultraviolet light-protect environment and mixed and stirred at room temperature (25° C.) for about 1 hour until it was completely dissolved to prepare a photocurable resin composition which was an achromatic transparent viscous liquid. (3) Vacuum casting under ultraviolet light-protected environment:

A silicon release agent was applied onto the surface of the vacuum casting mold having a copolymer coating layer obtained in (C) of (1) above, the vacuum casting mold was placed in a vacuum casting machine (manufactured by Janome Co., Ltd.) maintained at a temperature of 25° C. and a pressure of 9 mmHg, and the ultraviolet curable resin composition obtained in (D) of (2) above was injected into the vacuum casting mold and irradiated with ultraviolet light (3 KW, wavelength of 300 to 390 nm) for 10 minutes to cure the ultraviolet curable resin composition. Thus, a dumbbell-shaped molding was produced.

(4) Measurement of physical properties of molding:

The tensile properties (tensile strength, tensile elongation and tensile modulus) of the molding obtained in the above step (3) were measured in accordance with JIS K 7113 and the flexural elastic modulus at 50° C. of the molding was measured in accordance with JIS K 7207. The results are shown in Table 4 below.

The volume shrinkage factor was obtained from the above equation (4) and shown in Table 4.

TABLE 4

| Run No. | Acrylate compound | Physical properties of molding | | | | Volume shrinkage factor at the time of molding (%) |
| --- | --- | --- | --- | --- | --- | --- |
| | | Tensile strength (kg/mm$^2$) | Tensile elongation (%) | Tensile elastic modulus (kg/mm$^2$) | Flexural elastic modulus at 50° C. (kg/mm$^2$) | |
| 1 | AC-1 | 6.5 | 5.3 | 220 | 251 | 5.9 |
| 2 | AC-2 | 6.2 | 4.7 | 211 | 255 | 5.9 |
| 3 | AC-3 | 5.2 | 16 | 178 | 195 | 6.5 |
| 4 | AC-4 | 4.2 | 16 | 159 | 149 | 5.7 |
| 5 | AC-5 | 4.5 | 15 | 167 | 163 | 4.8 |

It is understood from the results of Table 4 that even when vacuum casting is carried out by irradiating the ultraviolet curable resin (composition) with ultraviolet light using the vacuum casting mold of the present invention which can transmit ultraviolet light, the resin is cured sufficiently and a molding having excellent physical properties can be obtained.

As described above, since the photocurable resin composition of the present invention is a low-viscosity liquid, has excellent handling properties and can be cured in a short period of time, it can be used effectively in the production of various moldings and stereolithographed objects by an optical irradiation method and the production of moldings by a molding-by-mold method.

When the photocurable resin composition of the present invention is used, a molding or stereolithographed object having excellent dimensional accuracy with a small volume shrinkage factor when it is photo-cured can be obtained. In addition, since a cured product such as a molding or stereolithographed object obtained from the photocurable resin composition of the present invention is excellent in flexibility, elastic recovery properties and mechanical properties such as tensile strength and tensile elongation, it can be used effectively for various applications, making use of these characteristic properties.

The vacuum casting mold of the present invention can be obtained extremely easily by optical shaping without a complicated mold production process using a master model, and has a high dimensional accuracy.

Since the vacuum casting mold of the present invention is excellent in such properties as flexibility, stretchability and elastic recovery properties, it has excellent release properties and hence, a molding obtained by vacuum casting can be easily taken out from the mold. Further, since it can restore its original shape after a molding is removed therefrom, it can be used repeatedly.

Particularly, a vacuum casting mold having a coating layer of a resin, inorganic material, metal material or the like on the molding surface thereof is more excellent in release properties and durability, in addition to excellent flexibility, stretchability and elastic recovery properties, and hence, can be used very effectively for vacuum casting.

The vacuum casting mold of the present invention can be used effectively for vacuum casting which uses ultraviolet curable resins and other polymer materials (polymerizable materials), and moldings having excellent physical properties can be obtained in either case.

What is claimed is:

1. A photocurable resin composition comprising:
   (A) at least one urethane acrylate selected from the group consisting of (a) a first urethane acrylate represented by the following formula (1):

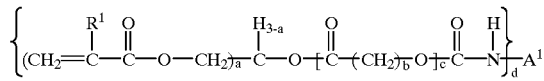
   (1)

wherein $R^1$ is a hydrogen atom or a methyl group, $A^1$ is a divalent or trivalent substituted or unsubstituted hydrocarbon group, a is 1 or 2, b is an integer of 3 to 6, c is an integer of 3 to 14, and d is 2 or 3, provided that at least one $R^1$ is a methyl group when a is 2, (b) a second urethane acrylate represented by the following formula (2):

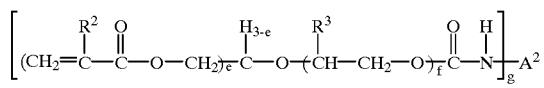
   (2)

wherein $R^2$ and $R^3$ are independently a hydrogen atom or a methyl group, $A^2$ is a divalent or trivalent substituted or unsubstituted hydrocarbon group, e is 1 or 2, f is an integer of 4 to 20, and g is 2 or 3, provided that at least one $R^2$ is a methyl group when e is 2, and (c) a third urethane acrylate represented by the following formula (3):

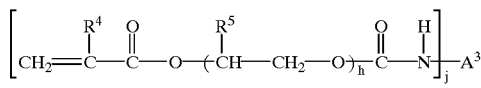
   (3)

wherein $R^4$ and $R^5$ are each independently a hydrogen atom or a methyl group, $A^3$ is a divalent or trivalent substituted or unsubstituted hydrocarbon group, h is an integer of 4 to 20, and j is 2 or 3, (B) a radical polymerizable compound different from the above urethane acrylate (A), and (C) a photopolymerization initiator, the weight ratio of the urethane acrylate (A) to the radical polymerizable compound (B) being 65/35 to 25/75.

2. The photocurable resin composition of claim 1, wherein the photopolymerization initiator (C) is contained in a proportion of 0.1 to 10% by weight based on the total weight of the urethane acrylate (A) and the radical polymerization initiator (B).

3. A photocurable resin composition according to claim 1, wherein the radical polymerizable compound (B) is at least one compound selected from the group consisting of morpholine methacrylamide and ethylene oxide modified bisphenol A diacrylate.

4. A method of producing a stereolithographed object comprising the steps of:
   irradiating a layer of the photocurable resin composition of claim 1 with an active energy light selectively to form a first cured layer having a desired pattern,
   forming a layer of the photocurable resin composition of claim 1 on the above first cured layer,
   irradiating the layer with an active energy light to form a second cured layer having a desired pattern, said second layer being integrated with the first cured layer,
   forming a third cured layer integrated with the second cured layer, and
   repeating this procedure until a desired stereolithographed object is formed.

5. A method according to claim 4 comprising selecting irradiating with an ultraviolet laser controlled by a computer to cure the composition to a predetermined thickness.

6. A method of producing a molding comprising the steps of:
   injecting a photocurable resin composition as defined in claim 1 into a mold and
   photocuring the composition in the mold to form a molding.

7. A method of producing a molding comprising the steps of:
   injecting a photocurable resin composition as defined in claim 2 into a mold and photocuring the composition in the mold to form a molding.

8. A method of producing a molding comprising the steps of:
   injecting a photocurable resin composition as defined in claim 3 into a mold under vacuum, and photocuring the composition in the mold to form a molding.

* * * * *